United States Patent [19]

Song

[11] 3,949,299
[45] Apr. 6, 1976

[54] SIGNAL CODING FOR TELEPHONE COMMUNICATION SYSTEM

[75] Inventor: Ching-Long Song, Columbus, Ohio
[73] Assignee: North Electric Company, Galion, Ohio
[22] Filed: Nov. 5, 1974
[21] Appl. No.: 520,977

[52] U.S. Cl............ 325/38 B; 325/62; 340/347 DD
[51] Int. Cl.² ........................................ H03K 13/22
[58] Field of Search ........ 325/38 B, 144, 321, 38 R, 325/62; 329/104; 332/11 D; 179/15 AZ; 340/347 DD; 333/14

[56] References Cited
UNITED STATES PATENTS

| | | | |
|---|---|---|---|
| 3,703,688 | 11/1972 | Flanagan | 325/38 B |
| 3,707,712 | 12/1972 | Deschenes | 325/38 B |
| 3,795,900 | 3/1974 | Monford | 325/38 B |
| 3,825,831 | 7/1974 | Ishiguro | 325/38 B |
| 3,835,385 | 9/1974 | Hoeschele | 325/38 B |

*Primary Examiner*—Benedict V. Safourek
*Attorney, Agent, or Firm*—Johnson, Dienner, Emrich & Wagner

[57] ABSTRACT

A telephone communication system reversibly converts input signals into adaptive delta modulated (hereafter ADM) signals and then into pulse code modulated signals. In one embodiment, an encoder of a telephone communication system receives analog signals, for example voice signals, in a comparator which also receives an analog signal from an integrator for periodically providing ADM signals. The ADM signals are provided to a pattern detector responsive to predetermined patterns of the ADM signals to supply a step size increase or decrease signal to the integrator which then generates the analog signal compared with the input signal for forming the ADM signals. Each signal from the pattern detector is a linear pulse code modulated (hereafter LPCM) signal representing a signal increment corresponding to that represented by the ADM signal. Each LPCM signal increment is then added to the total of each preceding LPCM signal increment to form LPCM signals representing the input analog signal. The LPCM signals are then periodically sampled and each sampled LPCM signal converted into a corresponding compressed pulse code modulated (hereafter CPCM) signal for switching and further transmission. In a receiving path of the embodiment, a converter converts input CPCM signals into LPCM signals. Each LPCM signal together with a locally generated signal representing the preceding LPCM signal is provided to a digital comparator which forms an ADM signal encoded in response to the relative magnitudes of the input and generated LPCM signals. The ADM signals are then provided to further means controlled by patterns of the ADM signals for providing a pattern controlled signal to an integrator which integrates the pattern controlled signal into an analog signal corresponding to the CPCM signal input to the receiving path of the embodiment.

29 Claims, 9 Drawing Figures

FREQUENCY MAGNITUDE CHARACTERISTICS OF THE UNIFORM FILTER (N=8)

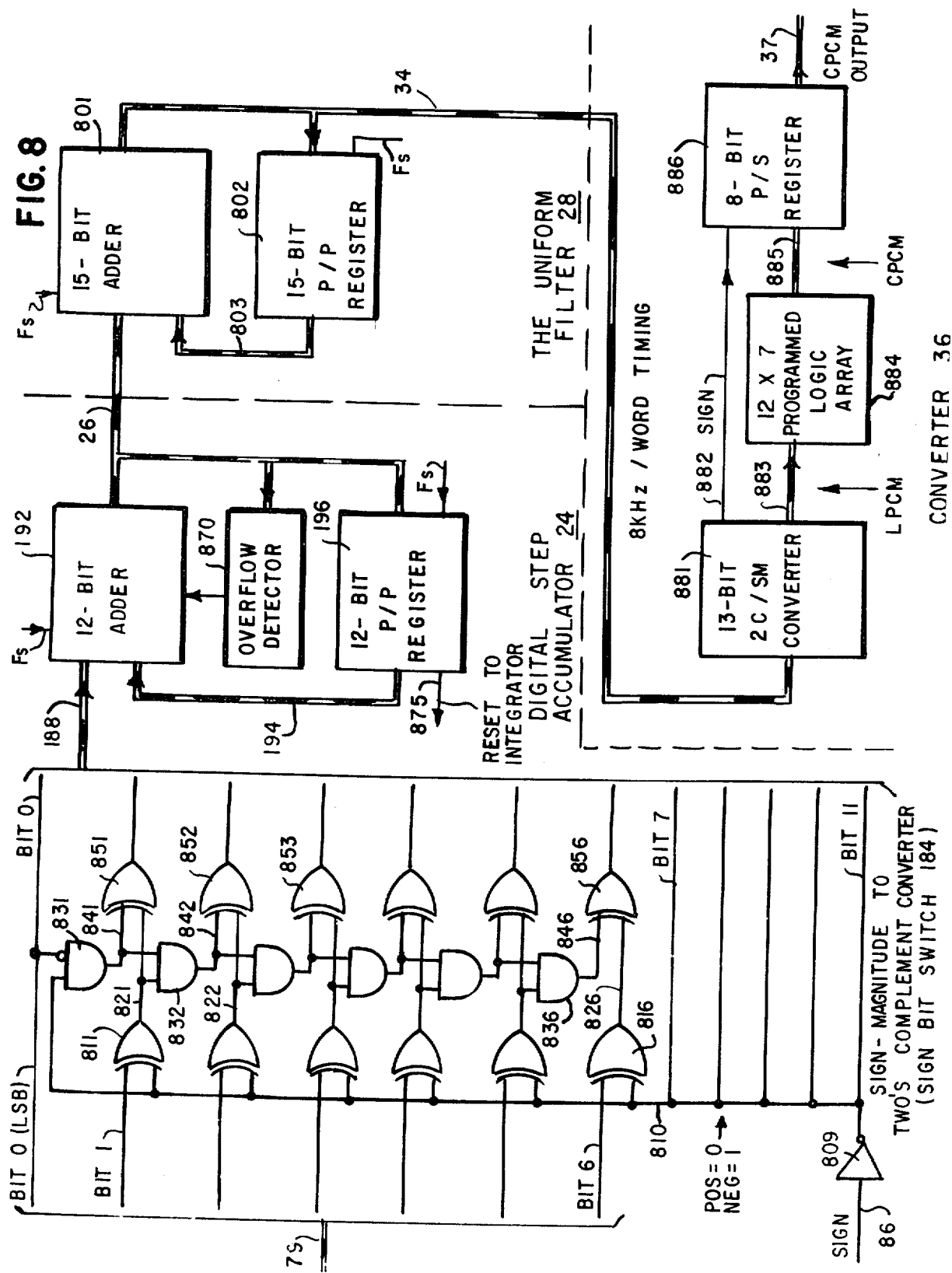

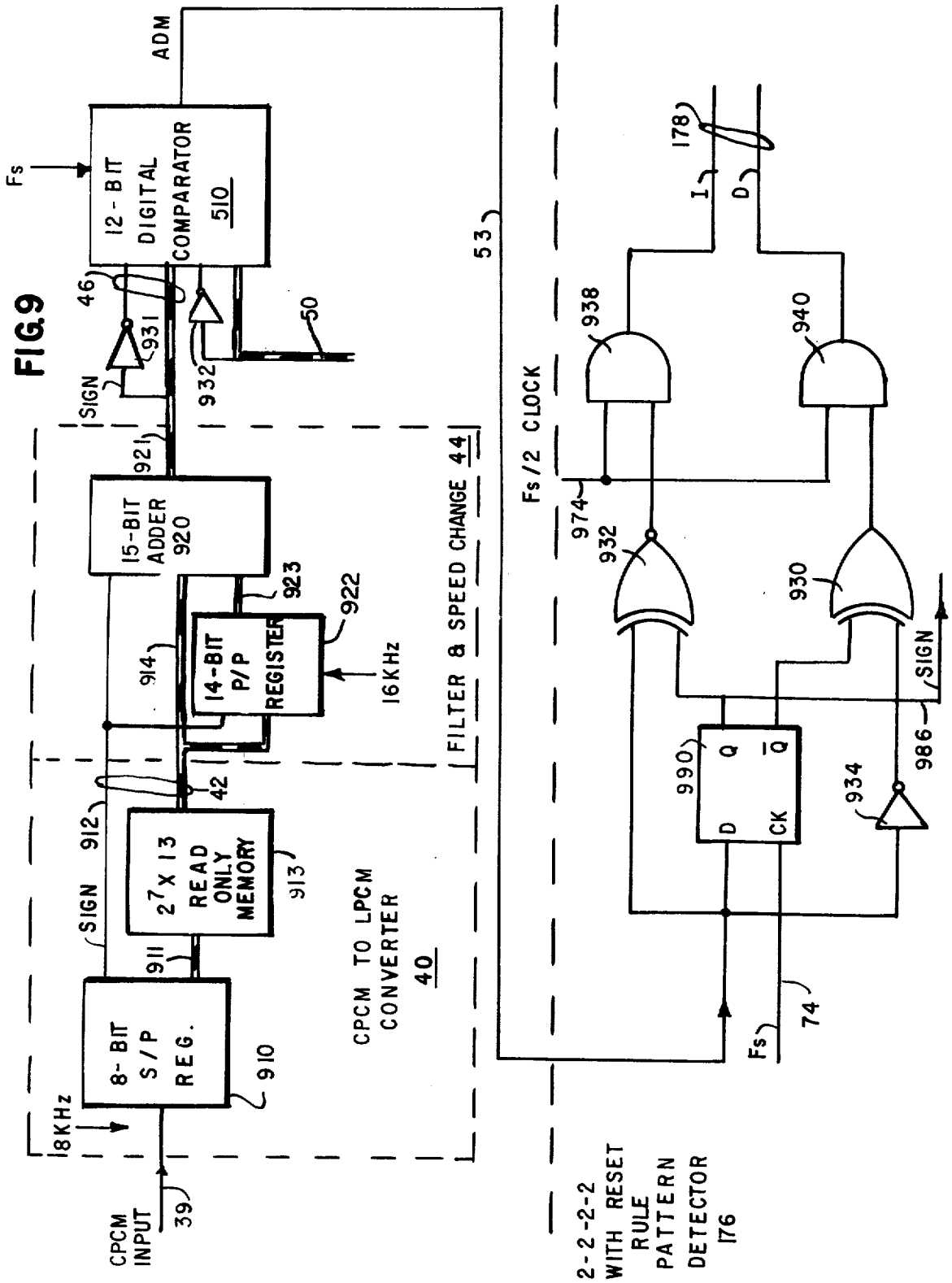

SIGNAL CODING FOR TELEPHONE COMMUNICATION SYSTEM

BACKGROUND OF THE INVENTION

This invention relates to a communication system and, more particularly, to a telephone communication system having adaptive delta modulated (hereafter ADM) signals.

The demand for communication services has been steadily increasing. In meeting this demand, it has proven effective in some communication systems to convert signals presented to the system into encoded digital signal, and then reconvert the encoded digital signals into signals corresponding to those originally input into the system. One example of a communication system in which such transmission of encoded digital signals has proven to have particular utility is a telephone communication system. Several schemes for digitally encoding signals in a telephone system are known. Although these encoding schemes are useful for both digital and analog signals input to the telephone system, they have particular utility with continuous input, time-varying analog signals such as voice signals.

In one encoding scheme, the amplitude of a voice signal is periodically sampled and each sample converted into a digitally encoded pulse sequence or word representing a quantum of analog signal amplitudes including that of the sampled signal. This operation is called sampling and quantizing the analog signal. If the range of analog signal amplitudes represented by each quantum level or step of the quantizing operation is uniform for all analog signal amplitudes, the encoded signal is said to be linear pulse code modulated (hereafter LPCM). Each LPCM signal word may then be decoded to form an analog signal of an amplitude substantially corresponding to the amplitude of the analog signal sample encoded into the LPCM signal word. Since the input analog signal was periodically sampled, the resulting, periodic LPCM signal words may be formed into a continuous analog signal substantially corresponding to the continuous input analog signal.

In the quantizing process, the exact level of the input analog signal at the sampling instant is, as described, approximated by one of a number of discrete values or quantum levels digitally encoded as the LPCM signal. The difference between the instantaneous amplitude of the input analog signal and the quantum level actually transmitted is called quantizing error and gives rise to what is variously known as quantizing noise or quantizing distortion.

Quantizing distortion is especially objectionable and very often intolerable when the instantaneous amplitude of the input analog signal is small, but is usually of little or no significance when the instantaneous amplitude of the input analog signal is high because the low amplitude of the input signal permits a relatively low level of quantizing noise to significantly degrade the ratio of signal to noise while a higher amplitude of the input signal can tolerate greater quantizing noise within an acceptable ratio of signal to noise. It is therefore desirable to have smaller quantum levels for lower amplitudes of the input signal to achieve closer correspondence between the quantum level of the encoded signal and the actual amplitude of the input analog signal at lower amplitudes of the input signal than for higher amplitudes of the input signal. Of course the size of the quantum levels for all input signal amplitudes could be decreased, but this produces an undesirable increase in the total number of quantum levels, requiring, for example, more binary bits to represent the signal as a digitally encoded word.

The suggested non-linear redistribution of the size of the quantizing levels is called companding, a verbal contraction of the terms compression and expanding. The purpose of companding is then to reduce the quantizing impairment of the original signal without unduly increasing the total number quantizing levels by quantizing on a non-linear rather than a linear basis.

It is current practice with telephone systems to compand encoded analog signals on either a "mu-law" or an "A-law" companding scheme as described by H. Kaneko in an article entitled "A Unified Formulation of Segment Companding Laws and Synthesis of Codecs and Digital Companders," *Bell System Technical Journal*, September, 1970. The resulting signals are then called compressed pulse code modulated signals (hereafter CPCM) or companded pulse code modulated signals. One device for so encoding input analog signals is disclosed in co-pending U.S. Patent application Ser. No. 385,095 filed Aug. 2, 1973, in the names of Wintz, Sergo and Song. Of course, CPCM signals may also be decoded into an analog signal. One device for so decoding CPCM signals is disclosed in co-pending U.S. Patent application Ser. No. 402,342 filed Oct. 1, 1973, in the names of Wintz and Sergo.

Still another scheme for encoding analog signals periodically samples the analog signal and compares the amplitude of the signal at each sampling instant with a signal representing the predicted amplitude of the analog signal from the immediately preceding sampling instant to form a binary-encoded signal from the comparator indicating by its one of the two possible binary states whether the instant sample of the analog signal is greater or less than the sample at the preceding instant. In general, the signal from the comparator is integrated to locally generate a signal representing the amplitude of the analog signal at the preceding sampling instant for comparison in the comparator with the instantaneous sample of the analog signal. Then, for example, if the input analog signal is greater at one sampling instant then the locally generated signal representing the amplitude of the analog signal at the immediately preceding sampling instant, the comparator provides a high logic level signal, and, if the input signal is less than the locally generated signal, the comparator provides a low logic level signal. Such binary-encoded, single-bit signals area called linear delta modulated (hereafter LDM) signals.

The effectiveness of such LDM signals in representing analog signals largely depends upon the accuracy of the locally generated signal in representing the preceding sample of the analog signal. It has been shown that the relative accuracy of the locally generated signal may be maximized by keeping the sampling rate high and the increments or quantizing steps in locally generating the signal representing the preceding analog signal relatively small to thereby provide quantum levels of an analog signal closely approximating the preceding signal sample so that the quantizing error in encoding an individual LDM signal will not represent a substantial excursion of the LDM signal from the actual input analog signal. Unfortunately, the sampling rates required to achieve the same quality or signal to noise ratio and dynamic range from such LDM signals in comparison to the same signal encoded in a 7-bit mu=255 8 kilohertz CPCM is 19.6 MHz and, in an 8-bit scheme, 39.2. MHz, frequencies substantially at the limit of some (such as MOS) modern digital technology.

Nevertheless, the relative simplicity of the LDM encoding scheme makes desirable the use of this scheme in telephone equipment, particularly telephone equipment between a subscriber and a central office which generally is not now digitally encoded. Given the large number of telephone subscribers, the simplicity and thus potentially lower cost of delta modulation equipment as compared to equipment providing CPCM signals offers economic attraction for the introduction of delta modulation devices into a telephone system. However, achieving the high frequencies required for LDM signals of a quality equivalent tto CPCM signals requires expensive, high-speed digital devices. In addition, the uncontrolled environment at the location of subscriber equipment makes such high-speed devices unreliable.

One solution to the high sampling frequencies required in the LDM signal encoding scheme is disclosed in co-pending U.S. Patent application Ser. No. 482,380 filed June 24, 1974, in the name of Song, hereinafter referred to as said first Song application. The communication system disclosed in this application has a uniform finite impulse response filter accumulating and sampling LPCM signals converted from input LPM signals. With this digital filter it may be theoretically demonstrated that mu=255, 7-bit CPCM quality signals may be achieved from 8 MHz LDM signals instead of the 19.6 MHz LDM signals required without the filter, and mu-255, 8-bit CPCM quality signals may be achieved from 16 MHz LDM signals instead of the 39.2 MHz.

Since the effectiveness of delta modulation in representing analog signals also depends upon the size of the quantizing levels or steps in locally generating the signal representing the preceding analog signal, attempts have also been made to vary the step size in locally generating the signal representing the analog signal at the preceding sampling instant. In general similiarity to the described CPCM signal companding scheme, the delta modulation step size is made smaller for ADM signals representing lower amplitude analog signals than for ADM signals representing higher amplitude analog signals. This technique is usually called adaptive delta modulation. Signals encoded in such a scheme are then called adaptive delta modulated (hereafter ADM) signals.

Several proposals for implementing ADM signal encoding schemes are reviewed in an article by H. R. Schindler, "Delta modulation," *IEEE spectrum*, October, 1970. As described in this article, one early proposal doubles the quantization step size of an integrator which locally generates an analog signal which is compared with the input signal to form the ADM signals in response to two consecutive ADM signals of identical logic state and halves the step size in response to two consecutive ADM signals of alternate logic state. This proposal then uses patterns of identical or alternating logic states of two consecutive ADM signals to control integration step sizes. Control of integration step size, being an analog procedure, is difficult to stabilize.

Other proposals continuously monitor an input analog signal to generate, in addition to ADM signals, a signal describing the quantization step size represented by the ADM signals. Both signaals are then transmitted to a detector which continuously applies the step describing signal to the successive ADM signals to generate an analog signal in which the increment represented by each ADM signal forming the analog signal is controlled by the separately transmitted signal. Such double signal transmission substantially defeats the attractive simplicity of the ADM signal encoding scheme.

U.S. Pat. No. 3,500,441 issued in the name of Brolin discloses another device for creating ADM signals from input analog signals. This device is similar to that just described in that the size of integration steps represented by each ADM signal is determined in direct response to changes in the input analog signal and the determined integration step size represented by a signal distinct from the ADM signal. However, in this device the distinct step signal is digitally encoded and time division multiplexed with the ADM signal for transmission to a decoder. The decoder then demultiplexes the two signals to control integration of the ADM signal with the distinct, digital step signal. Again, such double signal transmission substantially defeats the attractive simplicity of the ADM signal encoding scheme.

Another proposal for an ADM signal encoding scheme attempted to avoid the undesirable double signal transmission with a return to the concept of the above described early proposal in which the successive ADM signals themselves carry information indicating the analog increment represented by each ADM signal while, at the same time, retaining continuous control of the analog increment represented by each ADM signal. In this proposal the successive ADM signals are rectified into an analog signal which controls the local generation of a second analaog signal from each of the successive ADM signals. The second analog signal is then compared with the input analog signal for forming the ADM signals. The second analog signal is then compared with the input analog signal for forming the ADM signals. But, as with the early proposal, the control of one analog signal with another analog signal is difficult to stabilize for consistent control and matching of the characteristics of sending and receiving paths of the system.

Still another proposal has a sequence detector which detects one specific pattern of four consecutive ADM signals of identical logic state and, in response to the detected pattern, generates an analog signal potential which is a successive integral multiple of a constant determined by the logic state of the ADM signals forming the pattern. The analog potential then controls the width of a generated pulse which is therefore an analog time signal. The pulse then controls the duty cycle of a single current source driving an integrator which forms another analog signal which is compared with the input signal for forming the ADM signals. The analog signal increments represented by these ADM signals are theoretically logarithmically related but this proposal again teaches the difficult to stabilize analog control of an analog signal.

Other patterns of ADM signals for determining the increment of an analog signal represented by each ADM signal are discussed in "Adaptive Delta Modulation With a One Bit Memory," N. S. Jayant, *Bell System Technical Journal*, March, 1970. One specific pattern, later described by the 7-7-4-3 rule, was empirically developed by T. H. Daugherty as reported in "Digitally Companded Delta Modulation for Voice Transmission," 1970 IEEE Circuit Theory Symposium.

One arrangement making use of pattern detectors to generate and receive ADM signals and also to convert the ADM signals to LPCM signals is disclosed in co-pending U.S. Patent application Ser. No. 491,767, filed July 25, 1974, in the name of Song, hereinafter referred to as said second Song application.

U.S. Pat. No. 3,652,975 issued in the name of Goodman discloses another device for implementing an ADM signal encoding scheme in which analog signals are first converted at a high sampling rate into high-speed LDM signals and the high-speed LDM signals then converted in a counter into LPCM signals. The LPCM signals in the counter are compared in a comparator with signals from an accumulator representing the preceding LPCM signal. The comparator periodically provides lower rate, ADM signals which increment the accumulator. The accumulator is additionally responsive to digital logic which controls the number and sign of the accumulator increments for each ADM signal. Several embodiments of the digital logic are suggested. In one embodiment the digital logcic is a read-only memory which performs a known table-look-up function in response to detected patterns of successive ADM signals. In another embodiment the digital logic performs a calculating function in which each successive accumulator counting increment is an arithmetic function, that is, a constant increment added to or multiple of the previous increment. Although this device avoids analog control of an analog signal with digital logic and an accumulator, it requires high speed LDM signal encoding devices to provide high quality ADM signals.

SUMMARY OF THE INVENTION

It is therefore an object of the invention to provide a communication system utilizing ADM signals, and more particularly, to provide a communication system converting input signals into ADM signals and then with digital means converting the ADM signals into CPCM signals.

It is a further object of the invention to provide a communication system utilizing ADM signals in which patterns of the ADM signals are detected to provide a pattern controlled digital signal and the pattern controlled digital signal is converted into a pattern controlled analog signal for forming the ADM signals.

It is still a further object of the invention to provide a communication system, for example a telephone system, converting input analog signals through ADM signals into CPCM signals of a given quality without high quality, expensive analog filters for the input and output analog signals.

To these ends the invention provides a communication system having an encoder in which input signals are converted into ADM signals, and then by digital conversion into LPCM signals. The encoder preferably converts the LPCM signals to CPCM signals. In the encoder a step controller which includes a pattern detector for determining the step size or increment represented by each bit of the ADM signals is used in common for both the analog to ADM conversion and the ADM to LPCM conversion.

One embodiment of the system has particular utility in a telephone communication system in which analog signals, for example voice signals, are converted into ADM signals in a subscriber terminal of the sending path of the system. The ADM signals are then digitally converted into LPCM signals and the LPCM signals converted into CPCM signals which are compatible with commercial telephone equipment. In the receiving path of this telephone communication system, CPCM signals are converted into LPCM signals which are then digitally converted into ADM signals. The ADM signals are then converted into analog signals which, if the CPCM signals input to the receiving path were provided from the sending path as, for example, over span lines of a switching system between the central offices of the sending and receiving paths of the telephone system, will correspond to the analog signals originally input to the system.

One specific embodiment of a telephone communications system has several specific features. One specific feature of the specific embodiment is that the conversion from ADM signals to CPCM signals is purely digital; no expensive digital-to-analog and analog-to-digital conversions which necessarily contain high accuracy linear components to preserve the quality of the signal are involved in the conversion process.

DESCRIPTION OF THE DRAWINGS

Preferred embodiments which are intended to illustrate and not to limit the invention will now be described with reference to drawings in which:

FIG. 8 is a detailed functional block diagram of part of the sending encoder; and FIG. 9 is a detailed functional block diagram of part of the receiving decoder.

DESCRIPTION OF THE PREFERRED EMBODIMENT

General Description

Figure 1:
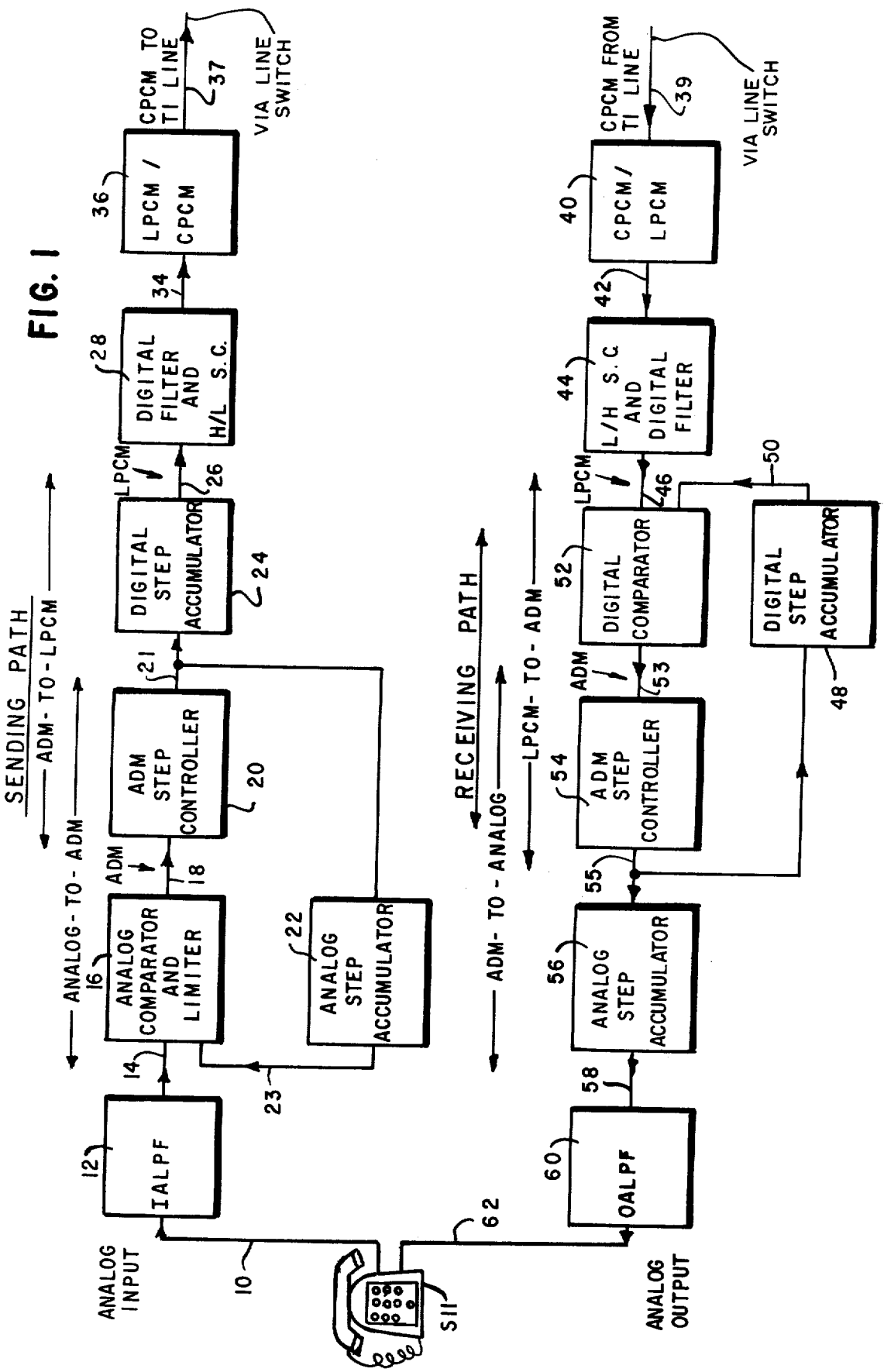
FIG. 1 is a block diagram of a sending path and a receiving path in one terminal of a communication system.
Figure 2:
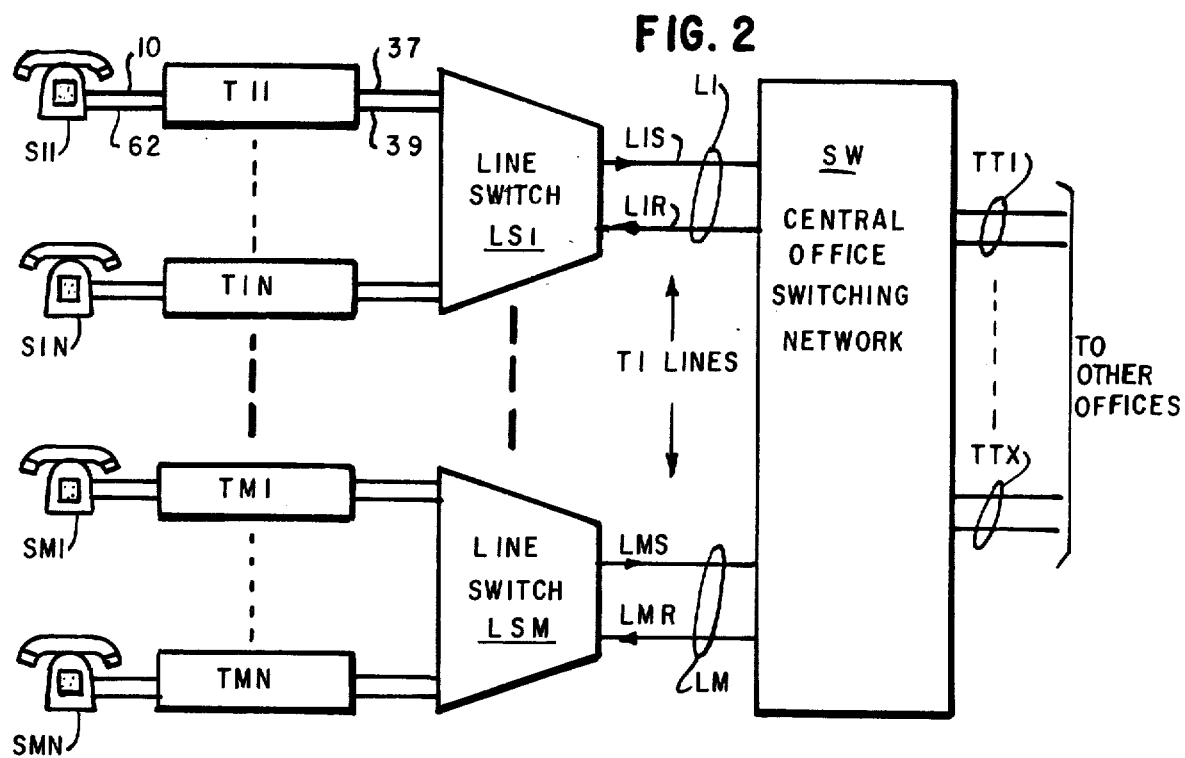
FIG. 2 is a block diagram of a communication system incorporating terminals as in FIG. 1.

The preferred embodiment is incorporated in a communication system, for example, a telephone system using pulse code modulation. FIG. 1 shows a line terminal comprising a sending path and a receiving path. This may, for example, be one of a plurality of terminals, such as terminal T11, serving a subscriber station S11, forming part of a switching and transmission system as shown in FIG. 2. In this system a central office switching network SW has access over T1 lines to a plurality of remote line switches and also has access to trunk lines that extend to other offices. For example, line switch LS1 is connected via at least one T1 line comprising a sending pair L1S and a receiving pair L1R to the network SW and there are a plurality of other such line switches up to and including line switch LSM which is connected via at least one T1 line comprising a sending pair LMS and a receiving pair LMR. There also may be T1 lines, such as TT1 to TTX, for connections to other central offices. Each line switch such as LS1 serves a plurality of subscriber stations each having its own subscriber terminal. For example, line switch LS1 has a plurality of terminals T11 to T1N serving subscriber stations S11 to S1N respectively. In like manner, the line switch LSM has terminals TM1 to TMN serving subscriber stations SM1 to SMN. Each of the terminals, such as T11, converts between the analog signals at its station, such as S11, and a digital line comprising a pair 37, and a pair 39 to the line switch. The signals from several terminals are multiplexed in each line switch such as LS1 to the T1 pair to the switching network SW at the central office. The switching network SW is a digital switching arrangement which selectively interconnects the various T1 lines. Although not shown in FIG. 1, in addition to the transmission sending and receiving paths, the terminals also include control apparatus for controlling the origination and termination of calls.

In the sending path of the terminal as shown in FIG. 1, continuous, time-varying analog input signals, such as voice signals, are provided over a path 10 from, for example, a telephone subscriber station S11. These analog signals are first filtered in an input analog low-pass filter 12 to band limit the frequency spectrum of the input analog signals. It should also be noted that the system will accept low rate digital signals instead of the described analog signals.

The band limited analog signals from the filter 12 are provided over a path 14 to a converter 16 which converts the analog signals into ADM signals output on path 18.

The analog-to-ADM converter portion of the encoder comprises three of the blocks shown in FIG. 1, i.e., the block 16 is an analog comparator and limiter; a block 20, designated ADM step controller determines the size of the delta modulation step represented by each ADM pulse; and a block 22, which contains an integrator, accumulates the steps and uses an integrator and converts them back to an analog signal for use in the comparator of block 16 to determine whether the nest pulse output as an ADM signal is a 1 or a 0.

Usually in a system using adaptive delta modulation, the ADM signals from line 18 would be supplied to a transmission line. However, in a terminal as shown in FIG. 1 these ADM signals are converted to pulse code modulation before being supplied to the transmission line 37. The signals are first converted to linear pulse code modulation and, as a feature of the invention, the ADM step controller 20 is also used as a portion of the ADM-to-LPCM converter. The remaining portion of this converter is a digital step accumulator 24 which supplies LPCM signals on line 26.

The ADM signals occur with one bit per sample at a sampling frequency Fs, which may be 384 KHz or 1.024 MHz for 7 or 8-bit CPCM quality. Since each bit of the ADM signals produces a full sample word of LPCM signals at path 26, the frequency Fs gives the word sampling rate.

The signals are then digitally filtered and converted from the high speed Fs to a lower speed by block 28 and supplied via line 34 as 8 KHz LPCM signals. The block 36 converts the signals from line 34 into compressed pulse code modulation signals supplied to the sending pair 37 of the T1 line.

In the receiving path, the CPCM signal words input over the pair 39 of the T1 line are each converted into LPCM signals in a converter 40. The signals from the converter 40 are then 8KHz LPCM signals which are provided to a path 42.

The signals from path 42 are digitally filtered and converted to a higher speed in block 44.

The LPCM signals on path 46 from the block 44 are then supplied to an LPCM-to-ADM converter which comprises a digital comparator 52, an ADM step controller 54 and a digital step accumulator 48. The digital comparator 52 compares the LPCM signals received on path 46 with locally generated signals from the digital step accumulator on path 50 to provide ADM signals on path 53. Patterns of these signals are detected in the ADM step controller 54 to provide a coded signal on path 55 indicating the size and sign of each of the ADM steps. These signals from path 55 are accumulated in a digital step accumulator 48 and supplied via path 50 to the comparator 52.

The ADM signals on path 53 are also supplied to an ADM-to-analog converter. As a feature of the invention, the ADM step controller 54 is common both to this converter and the LPCM-to-ADM converter. The remaining block of the ADM-to-analog converter is an analog step accumulator 56 which converts the digital signal from path 55 to bipolar analog step sizes and uses an integrator to accumulate the bipolar analog step sizes and provide analog signals on path 58. The analog signals on path 58 are then carried to an output analog low-pass filter 60 which band limits the signals from the converter 56 to eliminate quantizing noise and harmonic distortion of the reconstructed analog signal thereby avoiding waveform distortion of the output signal. The filter 60 then provides frequency filtered output analog signals over a path 62 to, for example, a subscriber station S11.

The Uniform Digital Filter

A digital filter 28 is used in the encoder of the sending path, to process the LPCM signals to provide higher quality or signal-to-noise ratio and dynamic range for a given sampling rate of the delta modulation. With adaptive delta modulation, the sampling rate is reduced from that required for linear delta modulation.

The use of digital filters is discussed by David J. Goodman in "The Application of Delta Modulation To Analog-To-PCM Encoding" in the Bell System Technical Journal, Vol. 48, No. 2 (February 1969), Pgs. 321–343. A finite impulse response digital filter may be used to make up for the loss due to the counting process. The amount of improvement depends upon the complexity of the filter used. To obtain a given performance in signal-to-noise ratio, the higher the sampling rate for the delta modulation the lower the complexity of the filter. The complexity of the filter in one aspect is expressed by its order or number of coefficients designated as N. For quality equivalent to 8-bit CPCM performance the signal-to-noise ratio should be approximately 38 db. Best performance can be obtained by using a recursive type digital filter, but such filters are too complex for use in an application in which the coder is individual to a subscriber line. Transversal type filters, such as those discussed by Goodman, require a multiplier circuit for each coeffecient which also adds to the complexity. If a uniform finite impulse response filter is used a simple structure may be obtained by use of an adder which accumulates N samples of the LPCM signals, and the result is then divided by N. If N is chosen as a power of 2, the dividing process is reduced too simply shifting the binary point. For example, if N is chosen equal to 8, then the dividing by 8 is accomplished by shifting the binary point three places.

Figure 3:
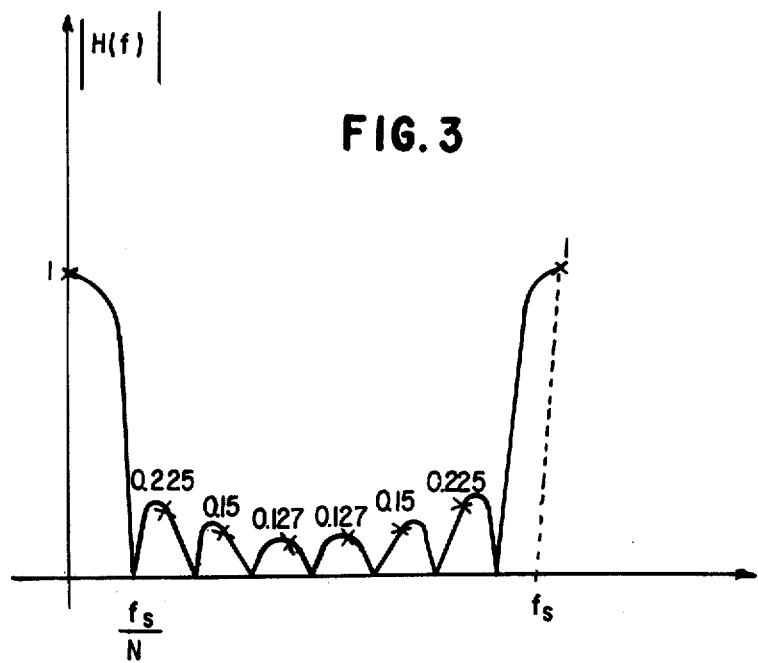
FIG. 3 is a graph of frequency magnitude characteristics of a uniform digital filter used in the terminal of FIG. 1.

The frequency magnitude characteristic of the uniform filter is shown by a plot in FIG. 3. The uniform filter rejects an increasing amount of noise outside the base band as the order N increases. The order of the filter cannot increase indefinitely with a fixed sampling frequency, however, the limitation is that the sampling frequency divided by N should be much greater than the maximum frequency of the signal. If this condition is not met then the signal will be attenuated by the transfer characteristics of the uniform filter. It can be shown that a uniform filter with N equal to 8 provides the speech quality equivalent to 8-bit CPCM (mu = 255) at the output of the uniform filter. Conceptionally the system works as follows. To compensate for the loss due to the imperfect filtering, with a uniform filter having N equal to 8, the operating frequency of the adaptive delta modulation ADM coder is increased to an appropriate value. To obtain 7-bit CPCM quality with the same uniform filter the system can operate at a substantially lower frequency.

The choice for the digital filter is a resettable accumulator for accumulating eight samples and then dividing by 8 by shifting the result three binary places. This filter can be operated to provide the output at the 8KHz rate which is the standard for CPCM signaling in the T1 carrier systems.

Overall Description of the Encoder

Figure 4:
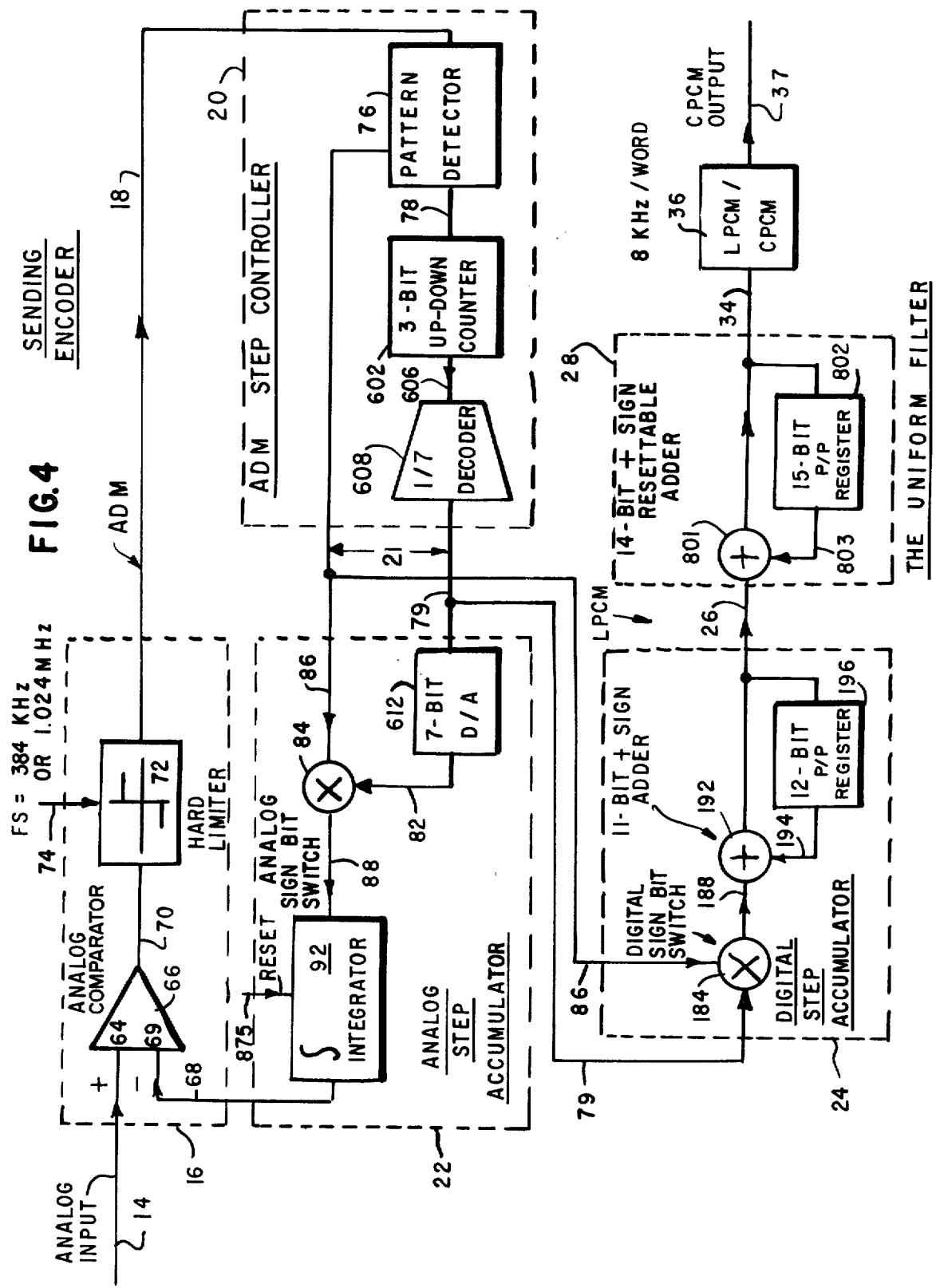
FIG. 4 is an overall functional block diagram of the sending encoder.

An overall functional block diagram of the encoder in the sending path is shown in FIG. 4.

As described with reference to FIG. 1, analog signals input over the path 10 are first band-pass filtered in analog filter 12 for output over the path 14. Specific designs for filters like filter 12 which pass a band or limit a spectrum of signal frequencies are well understood by those skilled in the art. Therefore, no specific design for filter 12 need be given, it being sufficient to refer to the performance requirements as described in said first Song application. As known for voice signals in telephone systems, such as the signals input on line 10, the signals have a principal signal frequency range in a 4 KHz band. The analog filter should have a 3db cut-off frequency at 3.2KHz and a pass band to stop band roll-off of 24db per octave to provide the signal spectrum desired.

As shown in FIG. 4, the signals on path 14 are provided to the analog-to-ADM signal converter. The converter 16 includes an analog comparator 66. The signals from path 14 are provided to port 64 which also receives analog signals from a path 68 at another port 69. The comparator 66 compares the amplitudes of the analog signals at the port 64, 69 to provide a high level signal to an output path 70 if the signal input to the port 64 exceeds that at the port 69, and a low level signal to the path 70 if the signal at the port 69 exceeds that at the port 64. The comparator 66 may be the type designated CMP-01 and commercially available from Precision Monolithics.

The signals on the path 70 are provided to a two-level quantizer 72 which also receives a signal on a path 74 from a clock (not shown) at a frequency Fs. Clock devices for producing pulse signals of preselected frequencies are well known in the art and need not be described here. The quantizer 72 functions to provide signals at one of two desired logic levels selected by the high or low state of the signals input over the path 70 only at each clock signal input over the path 74. The resulting signals output on the path 18 are then binary-encoded pulses at the frequency Fs. For this purpose, a quantizer 72 may be a commercially avaailable trigger device.

The signals on the path 18 are thus logic pulse signals at the frequency Fs, the logic levels of which are determined by the relative polarity of the analog signals input to the points 64,69 of comparator 66. The signal to the port 69 is locally generated from the signals on the path 18 in devices now to be described. However, it will be immediately appreciated that, since each output signal is locally generated into a signal at port 69, which by comparison with the input signal at port 64 determines the logic state of the next signal on path 18, the signals are delta modulation signals.

To locally generate the signals at port 69, the signals from path 18 are first provided to a pattern detector 76. The pattern detector 76 detects pre-selected patterns of the logic level of successive signals on the path 18. The specific pattern of the signals which the pattern detector 76 is preset to detect is determined with respect to the type of input signal and the desired performance of the system, for example, the desired signal to noise ratio. Several particularly desirable patterns are described in the second said Song application. Upon detecting the preset pattern, the detector 76 provides preset digital signals to output path 78. Since the detector 76 provides the output signals to path 78 in response to detected patterns of the input signals, the output signals are pattern controlled digital signals.

The pattern detector 76 is a part of the ADM step controller 20, whose function is to determine the specific signal increment represented by each ADM signal on path 18. In the preferred embodiment, this signal increment may have any of seven possible values for its magnitude, in addition to a positive or negative sign associated therewith. The specific value of this magnitude is determined by the state of the 3-bit up-down counter 602. Logic associated with this counter constrains it to having values with a minimum of 1 and a maximum of 7. Thus for each ADM signal input to the pattern detector 76, the up-down counter may either increase, counting up by 1, or decrease, counting down by 1, or it may remain at the previous state.

The output of the up-down counter 602 is decoded by a decoder 608 to provide an output of one of seven leads represented by path 79. Since the magnitude only of each signal is represented by the output of decoder 608, the sign must also be obtained. Each of the ADM signals on path 18 in addition to representing a particular magnitude also represents the sign which is positive for a 1 and negative for a 0 on this lead. This signal is delayed by one pulse interval in a device 90 to correspond to the average propagation delay introduced in the apparatus comprising the pattern detector 76, the counter 602 and the decoder 608, and the 7-bit D/A 612.

Thus, for each of the pulse signals on path 18 which are in ADM format, the ADM step controller produces an output on eight leads in path 21, comprising the magnitude represented on one of seven leads of path 79 and a sign on the single lead 86. The analog step accumulator 22 provides for a digital-to-analog conversion of the signals from path 21 to provide the signal on path 68 supplied to port 69 of the analog comparator. The magnitude signal on the seven leads of path 79 is supplied to a 7-bit digital-to-analog converter 612 which may be a commercially available device. This magnitude of the signal on path 82 from device 612 is combined with the sign on path 86 in an analog sign bit switch 84 with an output on path 88. The sign bit switch or amplifier 84 then provides an output signal to path 88 having the absolute amplitude of the pattern controlled analog signal input on path 82 but a sign polarity determined by the signal input on path 86. Then the signals on path 88 are output for each input signal on path 18 and have a sign controlled by the logic state of the corresponding one of the signals on path 18, but have an amplitude controlled by the patterns of the successive signals. The pattern controlled analog signals are provided to an integrator 92 which linearly integrates each pattern controlled analog signal from the path 88 as an increment to the preceding signals from the path 88 to form the analog signal output over path 68 to port 69 of comparator 66. It will be recalled that the signal to the port 69 determines, by comparison with the input signals on path 14, the signals on path 18. Then, since patterns of the signals on path 18 control the signal on path 88, which is an incement of the signal to port 69, and which is integrated at 92, the signals on path 18 are now seen to be ADM signals in which each signal on path 18 represents a variable increment of the input analog signal determined by the patterns of the preceding signals on path 18. Moreover, the specific size of the increment represented by each signal on path 18 was controlled by the amplitude of the pattern controlled analog signal from decoder 608 which has a base 2 exponential function as determined by the up-down counter 602 in the ADM step controller 20. Therefore, the preferred embodiment provides exponential logarithmic companding to the ADM signals on path 18 which is known to advantageously provide a constant signal to noise ratio to the ADM signals. Finally, the ADM signals on path 18 were derived from a pattern controlled digital signal which was converted into a pattern-controlled analog signal thereby avoiding difficult analog control of the analog signals known from the art. The above description covers the analog-to-ADM converter portion of the encoder.

For the ADM-to-LPCM converter, the signal on path 21 represents the signed increment or step of the LPCM signal corresponding to the increment or change in the analog signal originally input on the path 14, but not the total signed amplitude of the input analog signal. Further operation is required to provide the LPCM signal on path 26 which represents the full instantaneous signed amplitude of the input analog signal. This is accomplished in the digital step accumulator 24. The sign bit switch 184 introduces the sign from lead 86 to the LPCM increment signal on the seven leads of path 79 so that the sign is one of the bits of the LPCM increment signal on path 188. This function of the sign bit switch 184 will be recognized as equivalent to the function earlier described for the analog sign bit switch for amplifier 84. However, it will be noted that the sign bit switch 184 operates upon the digitally encoded LPCM increment signal word while amplifier 84 operates on an analog signal. In the LPCM signal scheme, the last or most significant bit of the LPCM signal word usually represents the positive or negative sign of the LPCM signal word. Therefore, sign bit switch 184 may comprise a commercially available signal control gate introducing the additional sign bit at the end of each LPCM signal word output over path 188.

An adder 192 receives the LPCM signal increment on the path 188 and an LPCM signal on the path 194 from a one-word delay device 196 (which is the same as the 12-bit P/P Register 196 of FIG. 8) representing the LPCM signal output from the adder 192. Then, each successive LPCM signal output on the path 26 is stored in the delay device 196 until the next LPCM signal increment appears on the path 188 and is then added in the adder 192 to the preceding LPCM signal from delay device 196. The adder 192 and delay device 196 may be in either serial or parallel form. The preceding LPCM signal from delay device 196 added to the next LPCM signal increment from path 188, with the appropriate sign from the larger signal, then forms the LPCM signal including the sign which is output over the path 26 to filter 28 and to the delay device 196 for addition to the next LPCM increment signal input over path 188.

The LPCM signals output on the path 26 are provided to the digital filter 28. The function and criteria of this filter has been described in the section above headed "The Uniform Digital Filter". One function of the filter is to band limit the wide-band quantizing noise generated during the ADM encoding of the input signal. Aliassing noise will then not occur from the high-speed LPCM signal as resampled to provide a low-speed LPCM signal on path 34. The filter comprises an adder 801 and a delay device 802 (which is the same as the 15-bit P/P Register of FIG. 8) which delays the sample by one word. The adder 801 and device 802 may be in either serial or parallel form. The filter accumulates eight words out of 48 words from the path 26 and divides by 8 which result is then output on path 34. To provide the division by eight function the signal is regarded as having been shifted by three binary places. A truncation to shorten the word length may also be provided. Preferably, the filter is of a design such that the storage in device 802 is reset at the end of the accumulation after output to path 34 so that the accumulation of the next eight samples starts from the value of zero. To provide for a speed conversion from the high speed of the LPCM signals to a lower speed, the timing arrangement is such that one word is output on path 34 every 125 microseconds to thereby obtain the 8KHz word rate required for T1 lines.

The LPCM signals on path 34 are then provided to the LPCM to CPCM converter 36. LPCM to CPCM signal converters are known. Therefore, no detailed illustration of the converter 36 need be given. One known type of LPCM-CPCM signal converter receives each bit of the LPCM signal in a serial to parallel shift register which then provides the LPCM signal in parallel format. The parallel LPCM signal is then provided to a read only memory which has preset appropriate code conversions for converting each LPCM signal into a CPCM signal. Another LPCM-CPCM converter is specifically described in the said second Song application.

Overall Description of the Decoder

Figure 5:
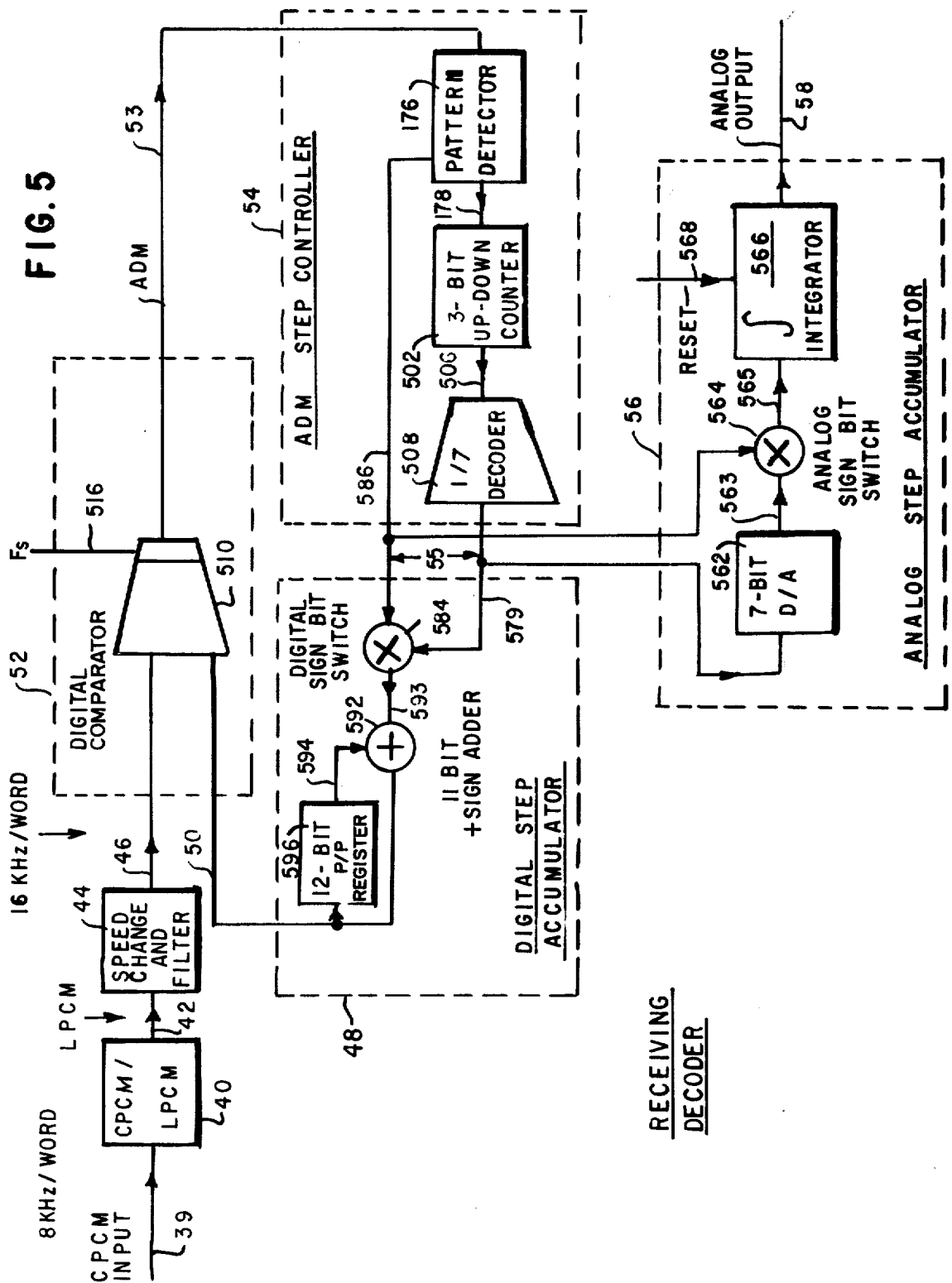
FIG. 5 is an overall functional block diagram of the receiving decoder.

An overall functional block diagram of the decoder in the receiving path is shown in FIG. 5.

Input CPCM signals are received on path 39, and supplied to the CPCM to LPCM signal converter 40. CPCM to LPCM signal converters are generally known and therefore require only a brief description. One such converter may be comprised of a serial to parallel shift register and a read-only memory device preset with the desired table of code conversion for forming the parallel CPCM signals input from the path 39 into corresponding LPCM signals on path 42. This CPCM to LPCM signal converter then performs a known table lock-up function in which each input CPCM signal is converted to an output LPCM signal on the path 42. Another CPCM to LPCM converter is described in said first Song application.

The LPCM signals on path 42 are then provided to the low-to-high speed converter and filter 44 which increases the frequency of the input LPCM signals to a 16 KHz word rate and provides a filtering function. The conversion from LPCM to ADM signals makes use of the digital comparator block 52, the ADM step controller 54, and the digital step accumulator 48. The digital comparator 510 in block 52 has one input on line 46 and another input from the digital step accumulator on path 50. These inputs may be in either serial form using a single lead for each input, or they may be in parallel form in which case path 46 and path 50 each comprise 12 leads. The digital comparator 510 includes the limiting function controlled by the clock signal Fs on lead 516. If the digital value represented by the word on path 46 is greater than that on path 50 the output on lead 53 is a 1, while if the value of the word on path 50 is greater then the output is a 0. It will be recognized that the output signals from the comparator 510 to path 53 are ADM signals.

The ADM step controller 54 comprises a pattern detector 176, a three bit up-down counter 502, a decoder 508 and a delay device 590 which is generally similar to the corresponding units in the ADM step controller 20 of the sending encoder shown in FIG. 4.

The digital step accumulator 48 comprises a digital sign bit switch 584, an adder 592 and a one-word or sample delay device 596 (a 12-bit P/P register) which are generally similar to the units 184, 192 and 196 of the digital step accumulator 24 shown in FIG. 4.

Thus, the ADM signals on path 53 are processed in the ADM step controller 54 to provide at the output path 55 an LPCM increment signal with the sign on lead 586 and the magnitude represented on one of the seven leads of path 579. The digital step accumulator 48 accumulates these LPCM increment signals to provide the full LPCM word representing the sample value for each word, which is supplied via path 50 to the digital comparator 510.

The conversion of the ADM signals on path 53 to analog output signals on path 58 makes use of the ADM step controller 54 and an analog step accumulator 56. The analog step accumulator 56 makes use of a digital-to-analog converter 562, an analog sign bit switch 564 and an integrator 566 which are generally similar to the units 612, 84, and 92 in the analog step accumulator 22 of FIG. 4. Thus, the incremental LPCM signals for each step output on path 55 from the ADM step controller 54 are converted by the analog step accumulator 56 into analog output signals on path 58.

As shown in FIG. 1, these analog output signals are passed through an output analog low-pass filter 60 to the analog output line 62 which may be supplied as voice signals, for example, to the subscriber station S11.

Description of the Pattern Detectors

The principle of the pattern detectors and several embodiments thereof are described in the second one of the above-identified Song applications.

One specific embodiment of the pattern detectors follows a rule designated 7-7-4-3 which was empirically developed to provide maximum signal-to-noise ratio on sinusoidal input signals as described by Daugherty "Digitally Companded Delta Modulation for Voice Transmission". The algorithm of the 7-7-4-3 rule for companding ADM signals is described as follows:

if the last change in companding the ADM signals was to increase the step, seven consecutive ADM signals of identical logic state are required for a further increase, but only four consecutive ADM signals of alternating logic state are required for a decrease in the step;

if, on the other hand, the last change in companding the ADM signals was to decrease the step, seven consecutive ADM signals of alternating logic state are required for a further decrease, but only three consecutive ADM signals of identical logic state are required for an increase in the step.

Figure 6:
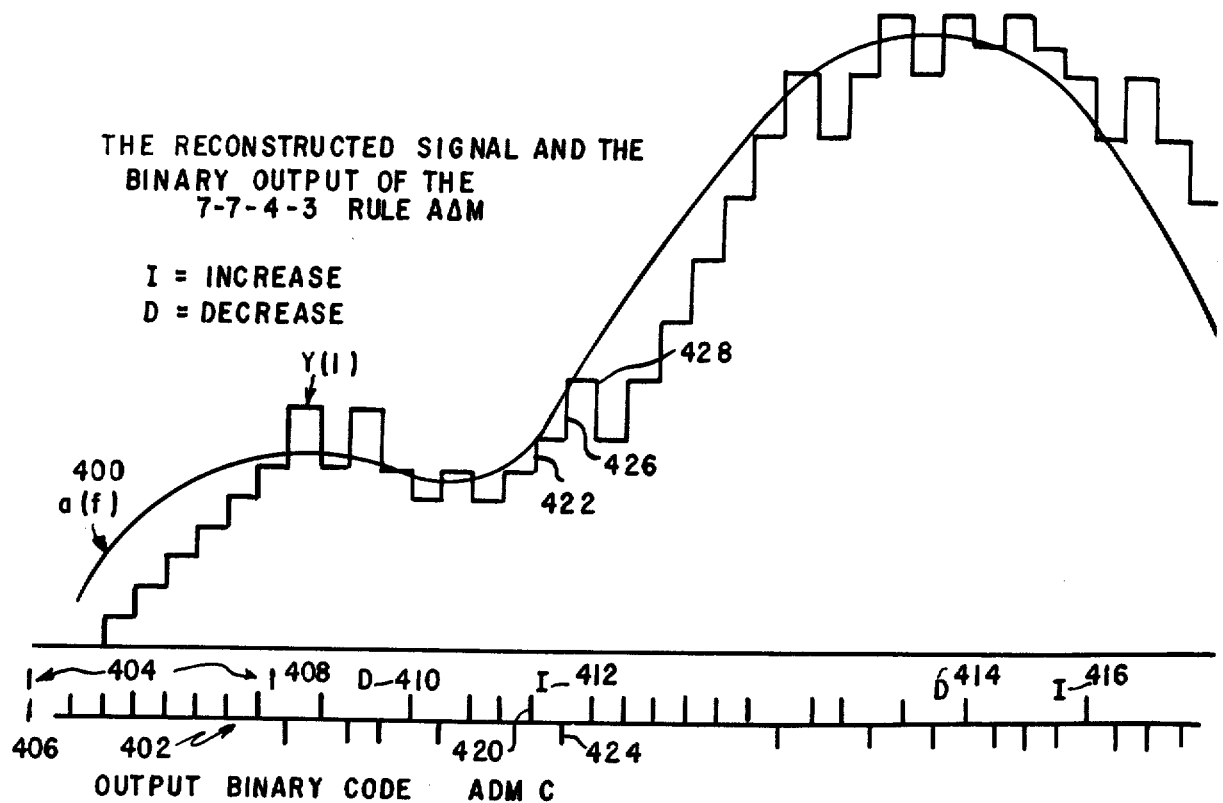
FIG. 6 illustrates signals from a signal pattern detector, for example a signal pattern detector shown in FIG. 4, which pattern detector is shown in detail in FIG. 7.

FIG. 6 illustrates the application of the described 7-7-4-3 rule to the pattern detector 76 of the analog to ADM converter 16 shown in FIG. 4.

FIG. 6 shows at 400 an arbitrary portion of the input analog signal $a(t)$ input over path 14 (FIG. 4) as a function of time $t$. As described with reference to FIG. 4, the input analog signal is converted to ADM signals $c$ at a 384 KHz sampling rate to form the binary-encoded single bit ADM signals $c$ shown at 402 in FIG. 6. Also shown in FIG. 6 are the pattern controlled digital signals 404 output on the path 78 from pattern detector 76 as described with reference to FIG. 4. The signals 404 (FIG. 6) are binary-encoded bits representing by their logic state a command for an increase with a signal of logic stage I, or a decrease with a signal of logic state D, in the increment of signal $a(t)$ represented by each of the ADM signals $c$. Then, inspection of FIG. 6 indicates that the pattern controlled digital signals 404 from the pattern detector 76 (FIG. 4) follow the above stated 7-7-4-3 rule.

For example, from an initially preset increase signal I at 406, seven consecutive ADM signals of identical logic state occur to trigger a next digital increase signal I at 408. Then, continuing the example, four ADM signals of alternating logic state (including the last of the seven identical logic state ADM signals determining the pattern controlled increase signal I at 408) occur to trigger a pattern controlled digital decrease signal D at 410. The signals at 406, 408, and 410 thus illustrate the first portion of the above described 7-7-4-3 rule.

Now the last pattern controlled digital signal D at 410 indicating a decrease in the increment represented by each succeeding ADM signal, three consecutive ADM signals of identical logic state are required to trigger a pattern controlled digital signal indicating an increase in the increment represented by each succeeding ADM signal as shown by the pattern controlled digital signal I at 412. The signal I at 412 thus illustrates the second portion of the above described 7-7-4-3 rule.

The last pattern controlled digital signal at 412 now indicating an increase in the increment represented by each ADM signal, seven consecutive ADM signals of identical logic state are again required for a further signal indicating an increase in the increment represented by the ADM signal. As illustrated in FIG. 6, however, four ADM signals of alternate logic state first occur to trigger a digital pattern controlled signal D at 414 indicating a decrease in the increment represented by each succeeding ADM signal. Three consecutive ADM signals of identical logic state are then required to trigger an increase in the increment represented by each pattern controlled digital signal as indicated by the signal I at 416.

In comparing the three consecutive ADM signals triggering the pattern controlled digital increase signals I at 412 and 416, it is noted that the ADM signals triggering the pattern controlled signal I at 412 are of one logic state while those triggering the pattern controlled signal I at 416 are of the other logic state. This operation corresponds with that described with reference to FIG. 4 for the pattern detector 76 where it was noted that the pattern controlled signals represent the magnitude only of the increment represented by each ADM signal, the sign of the increment being separately introduced through delay device 90 and sign controlling, unity gain amplifier 84.

Then, as also described with reference to FIG. 4, the pattern controlled, signed, analog increment signals from amplifier 84 are provided to integrator 92 for integration into an analog signal corresponding to that represented by the successive ADM signals. This analog signal $y(t)$ in the integrator 92 is shown as a function of time $t$ in FIG. 6 before being filtered by a smoothing filter (not shown) in the integrator 92 (FIG. 4) for output over the path 68 (FIG. 4). Then, as shown in FIG. 6, the magnitude of the increment in the signed $y(t)$ represented by each ADM signal is shown to be controlled by the pattern controlled digital signals 404. For example, the magnitude of the increment represented by one ADM signal at 420 is indicated at 426 in signal $y(t)$ while an increased increment represented by the next ADM signal $c$ at 424, which follows the pattern controlled digital increase signal I at 412, is shown as the increased increment in the signal $y(t)$ at 428. It is also noted that the sign represented by the logic state of the ADM signal at 420 is delayed in delay device 90 (FIG. 4) to control the polarity of the next increment in the signal $y(t)$ at 426 while the sign represented by the ADM signal at 424 controls the polarity of a next increment 428 of signal $y(t)$, the size of the increment 428 being still controlled by the last preceding pattern controlled digital signal I at 412.

Table I

| Pattern Controlled Digital Signals | 7-7-4-3 Rule Controlling ADM Signal Pattern | Pattern Controlled Digital Signals |
|---|---|---|
| ...= I | 1 1 1 1 1 1 1 | = I... |
| ...= I | 0 0 0 0 0 0 0 | = I... |
| ...= D | 1 1 1 | = I... |
| ...= D | 0 0 0 | = I... |
| ...= I | 0 1 0 1 | = D... |
| ...= I | 1 0 1 0 | = D... |
| ...= D | 1 0 1 0 1 0 1 | = D... |
| ...= D | 0 1 0 1 0 1 0 | = D... |

Table I summarizes the earlier description of the 7-7-4-3 rule the operation of which in pattern detector 76 (FIG. 7) has just been described with reference to FIG. 6. At the left of Table I are shown the possible states of the last provided pattern controlled digital signals, for example signals 404 (FIG. 6), followed by the patterns of the ADM signals $c$ controlling a next pattern controlled digital signal indicated at the right of the table. Table I then indicates that three logic conditions are necessary to implement the 7-7-4-3 rule. These conditions are: determine the logic state of the previous pattern controlled digital signal as an increase signal I or a decrease signal D of the increment represented by each succeeding ADM signal; determine the pattern of the succeeding ADM signals; and determine the number of the ADM signals forming the pattern. Further inspection of Table I indicates that there are only two patterns of ADM signals to be detected, namely, identical logic states of the ADM signals and alternating logic states of the ADM signals. At the same time, it is observed that the number of ADM signals forming a controlling pattern requires counting the ADM signal bits forming the pattern and that determining the previous pattern controlled digital signal requires retention of the previous I or D digital signal.

Figure 7:
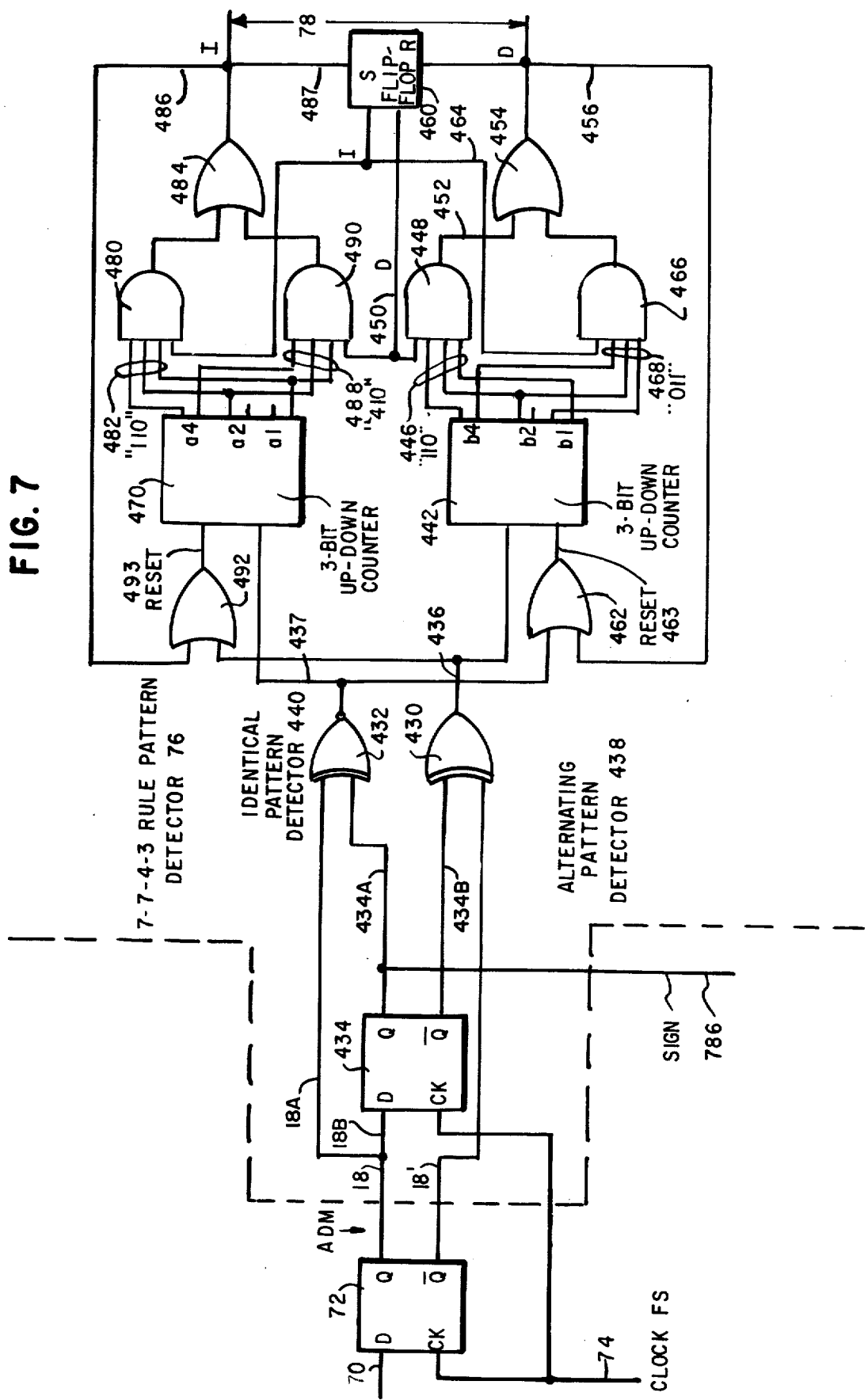
FIG. 7 is a detailed functional block diagram of a pattern detector.

FIG. 7 then shows a particular implementation of pattern detector 76 for the 7-7-4-3 rule summarized in Table I. The limiter 72 of FIG. 4 is shown in FIG. 7 as a flip-flop 72 of the D type. FIG. 7 then shows the ADM signals output from flip-flop 72 and input over the path 18 to the pattern detector as being provided to another D type flip-flop 434, which also provides the function of delay device 90 of FIG. 4, in supplying the sign on lead 786, and also to an input port of an inverting exclusive OR gate 432. The $\overline{Q}$ output of flip-flop 72 on lead 18' is supplied to an input port of an exclusive OR gate 430. Flip-flop 434 provides a one-bit delay. The device 434 delays each ADM signal input from the path 18 until the next ADM signal is received on the path 18 and then outputs the previous ADM signal from its outputs Q and $\overline{Q}$ to another input port of exclusive OR gates 432, 430 respectively. Each of the gates 430, 432 then simultaneously receives an ADM signal from the path 18 and the ADM signal previously on path 18 from the delay device 434. The flip-flops 72 and 434 may, for example, be a commercially available type SN 7474 with clock input at frequency Fs on lead 74.

Then, in operation, the non-inverting exclusive OR gate 430 simultaneously receives each successive ADM signal and the immediately preceding ADM signal to respond to the alternate logic states of the ADM signals with a logic one output on a path 436. Since each logic one output on the path 436 then represents an alternation in the logic states of consecutive ADM signals $c$ on the path 18, the output signals from gate 430 are those from a detector 438 of alternating ADM signal patterns. Similarly, inverting exclusive OR gate 432 responds only to consecutive ADM signals of identical logic state with a logic one signal on an output path 437 to thereby form a detector 440 of identical patterns of the ADM signals.

Each logic one signal on the path 436 from the alternating pattern detector 438 then corresponds to one alternation in the logic states of two consecutive ADM signals on the path 18. If a next or third ADM signal input on the path 18 again alternates in logic state from the immediately preceding or second ADM signal which triggered the first logic one onto the path 436, a second logic one signal is provided to path 436. Then extending this operation of pattern detector 438 to the seven alternating ADM signals indicated in the ADM signal pattern shown in the last row of Table I, it will be understood that the indicated pattern of ADM signals triggers six consecutive logic one signals onto the path 436.

The logic signals on path 436 are provided to a commercially available reversible or up-down three-bit counter 442 which increments in response to each logic one signal input on path 436. Each increment of the counter is binary encoded, the logic state of each bit of the counted increments being represented by a logic one signal at one of two discrete output ports of the counter, each pair of ports corresponding to one bit place of the counted alternating logic states of the ADM signals. For example, the pair of discrete output ports Q, $\overline{Q}$ each correspond to one bit place of the counted increments. A logic one signal at the port Q represents a count of one in the corresponding bit place while a logic one at the port $\overline{Q}$ represents a logic zero in the bit place. Following this scheme, a logic one signal from the port Q in the most significant bit (MSB) place b4, the port Q in the next bit place b2, and the port $\overline{Q}$ in the least significant bit (LSB) place b1 in counter 442 represents a binary-encoded count of 110 or six logic one signals input over the path 436, it being recalled that these six signals represent seven ADM signals of alternating logic state input to the alternating pattern detector 438 over path 18.

Turning again to Table I, it is seen that the pattern of seven consecutive ADM signals of alternating logic state is a controlling pattern when, and only when, the preceding change in the signal increment represented by the ADM signals is a decrease in the size of the increment indicated by a pattern controlled digital signal D. Then, the ports of counter 442 for "110" are connected over paths 446 to input ports of an AND gate 448. AND gate 448 is also connected to a path 450. A logic one signal on the path 450 represents, as will be described, an immediately preceding decrease in the signal increment represented by each ADM signal. AND gate 448 then provides a logic one signal over path 452 through an OR gate 454 to an output path 456. This signal is then a digital signal D controlled by the described pattern of seven alternating ADM signals as indicated in Table I.

The logic one signal on path 456 is provided to a reset port R of a flip-flop 460 to reset the flip-flop to provide a logic one signal to the path 450. Since it was earlier assumed that the path 450 already carried a logic one representing a prior decrease in the increment represented by each ADM signal, the logic one signal now on the path 450 in response to the logic one signal from path 456 does not represent a change in state of the signal from flip-flop 460.

The logic one signal on path 456 is also provided through an OR gate 462 to a reset port 463 of the counter 442 to reset the counter to its full zero count. Counter 442 is then reset for detecting a next pattern of the ADM signals.

If, on the other hand, the last preceding change in the size of the signal increment represented by each ADM signal had been an increase as represented by a signal I from flip-flop 460, no logic one signal will be carried on path 450 to AND gate 448. AND gate will then not provide a logic one signal to the path 452 for output on path 456 through OR gate 454. However, a logic one signal representing the increase signal I is carried on a path 464 from flip-flop 460 to an input port of an AND gate 466. A review of Table I indicates that, following an increase in the signal increment represented by each ADM signal, the controlling pattern of ADM signals is four alternating logic states of consecutive ADM signals. The above description of the alternating pattern detector 438 indicates that this pattern of ADM signals is represented by three logic one signals on the path 436 to counter 442. Counter 442 counts these logic one signals to reach a binary-encoded count of three, 011 in binary notation. These ports are then connected over paths 468 to AND gate 466 and their logic one signals at the fourth of the alternating ADM signals together with the logic one signal on the path 464, the preceding increase signal I, trigger a logic one signal from AND gate 466. The signal from gate 466 is provided through OR gate 454 to the output path 456. As before described, the logic one signal on path 456 is a decrease signal D as indicated in Table I. Also as before described, the signal on path 456 is provided to port 463 to reset counter 442. The logic one signal on the path 456 is also provided to the reset port R of flip-flop 460 to provide a logic one signal to the path 450 from the flip-flop. Since it was initially assumed that path 464, and not path 450, carried a logic one signal, the logic one signal now provided to path 450 is a change of state in flip-flop 460.

Returning to the path 437 which, it will be recalled, receives logic one signals from inverting exclusive OR gate 432 in response to consecutive ADM signals c of identical logic state, it is seen that path 437 carries these logic one signals to an input port of a counter 470 which, like the counter 442, counts each successive logic one input signal. Turning to Table I, it is seen that, following an increase signal I, the controlling pattern of the ADM signals is seven consecutive ADM signals of identical logic state which, as with the logic one signals on path 436, will be represented by six logic one signals on the path 437. Accordingly, output ports a4, a2, a1, corresponding to the most significant bit (MSB) place to the least significant bit (LSB) place for value 110 of the counter 470 are connected to input ports of AND gate 480 via paths 482. AND gate 480 also receives the logic one signal on path 464 representing an immediately preceding increase in the signal increment represented by each ADM signal to then provide a logic one signal through an OR gate 484 to an output path 486 which signal then represents an increase signal I and an increase in the size of the increment represented by each following ADM signal.

The logic one signal on the path 486 is provided to a set port S of flip-flop 460 to set the flip-flop to provide a logic one signal to the path 464. This signal corresponds to the increase signal I to control the patterns of the following ADM signals to which the pattern detector responds. The logic one signal on path 486 is also provided through OR gate 492 to a reset port 493 of counter 470 to reset the counter to its full zero state.

It may now be quickly seen that the controlling pattern of three ADM signals of identical logic state following a decrease in the increment represented by each ADM signal as shown in Table I, will be indicated by two successive logic one signals on the path 437. These two signals on path 437 are counted in counter 470 to provide logic one signals at the ports a4', a2, a1' of the counter. These ports are connected via paths 488 to AND gate 490 which also receives the logic one signal on the path 450 which corresponds to the preceding decrease signal D. Gate 490 then provides a logic one signal through gate 484 to the set port S of flip-flop 460. Flip-flop 460 then changes state to provide a logic one signal to the path 464, corresponding to the increase in the increment represented by each following ADM signal now indicated by the signal on path 486.

From the above description of the 7-7-4-3 rule pattern detector, it may be seen that the initial, preset digital pattern controlled signal I at 406 (FIG. 6) may be introduced by a logic one signal on path 487 from a source (not shown) and appropriately timed with the first ADM signal on path 18 to the pattern detector. The logic one signal on path 487 is provided to the set port S of flip-flop 460 to set the flip-flop to provide a logic one signal to path 464, which, as before described, is a digital signal I representing an increase in the increment of signal y(t) (FIG. 6) as specifically shown at 406 (FIG. 6).

It is noted that the logic one signals on the path 436 are also provided through OR gate 492 to the reset port 493 of the counter 470 while the logic one signals on the path 437 are similarly provided through OR gate 462 to the reset port 463 of counter 442. Thus, each alternation of the logic states of consecutive ADM signals as indicated by a logic one signal from alternating pattern detector 438 on path 436 will reset counter 470, while each identical pattern of the logic states of the ADM signals as indicated by a logic one signal from identical pattern detector 440 on path 437 will similarly reset counter 442. These reset functions of the signals from pattern detectors 438,440 disable each of the counters 442, 470 from responding to an interrupted pattern of alternating or identical ADM signals, it being noted that more than one signal on the paths 436, 437 is necessary to increment the respectively connected counters 442, 470 to a count triggering a logic one signal for output on paths 456,486. For example, a detected identical pattern of ADM signals triggering a logic one signal onto the path 437 from identical pattern detector 440 followed by an ADM signal of alternate logic state triggering a logic one signal to the path 436 from alternating pattern detector 438 which is, in turn, followed by another identical pattern of ADM signals again triggering a logic one signal to path 437 from identical pattern detector 440 will not increment counter 470 to its two state because the logic one signal on path 436 between the logic one signals on path 437 reset counter 470 to its full zero state.

It is now seen that the logic one signals on output paths 486,456 represent the digital signals I, D controlled by the patterns of ADM signals input to the pattern detector 76 for indicating by their logic state (and path) an increase or decrease in the increment represented by each following ADM signal. These, then, are the signals earlier described for output path 78 (FIG. 4) which is now shown as discrete paths 456, 486 (FIG. 7).

The pattern detector 176 shown in FIG. 5 for the decoder need not be the same as the pattern detector 76 used in the encoder. FIG. 9 at the bottom shows an implementation of a 2-2-2-2 with reset rule pattern detector. A D-type flip-flop 990 serves to provide a delayed signal for the pattern detection, and may also be used as the one bit delay 590 of the ADM step controlled 54 shown in FIG. 5, providing a sign signal on lead 986. The ADM signal on lead 53 input to the pattern detector is supplied to the D input of flip-flop 990 and also to a port of inverting exclusive OR gate 932. The signal from lead 53 is also inverted, via an inverter 934, and supplied to an input port of exclusive OR gate 930. The Q output of the flip-flop 990 is supplied to another port of gate 932 and the Q̄ output is supplied to a port of gate 930. Thus inverting exclusive OR gate 932 detects a pattern of two successive ones or two successive zeros, and exclusive OR gate 930 detects an alternating pattern. The output of gate 932 is connected to an input of an AND gate 938, and the output of gate 930 is connected to an input of an AND gate 940. The clock signal on lead 974 is supplied as another input of each of gates 938 and 940. The outputs of gates of 938 and 940 on leads I and D respectively of path 178 provide the increase and decrease signals for the three-bit up/down counter 502 shown in the step controller 54 in FIG. 5.

The minimum distinguishing pattern of ADM signals is, of course, a pattern of two consecutive identical ADM signals. The 2-2-2-2 without reset rule implements this scheme for patterns of two consecutive ADM signals of alternating logic states and for two consecutive ADM signals of identical logic states. Therefore, the rule may be stated as follows:

Two consecutive ADM signals of identical logic states require an increase in the increment represented by each following ADM signals; and two consecutive ADM signals of alternating logic states require a decrease in the signal increment represented by each following ADM signal.

A 2-2-2-2 rule with reset differs from the above in that for alternate bits the increase or decrease output signal is inhibited. This is illustrated in FIG. 9, by the clock signal Fs/2 on lead 974 with a 50% duty cycle being true only for alternate bit times of the ADM data signals. The 2-2-2-2 rule without and with reset may be illustrated by the following table:

| Clock Fs/2 | 0 1 0 1 0 1 0 1 |
|---|---|
| ADM data | 1 0 1 0 1 1 0 0 |
| Without reset | D D D D I D I |
| With reset | D - D - I - I |

Note that without reset, the step size changes for every bit, while with reset the step size changes only on alternate bits. However if the step size reaches the minimum value decrease signals have no effect; and with the maximum step size, increase signals have no effect.

In the decoder, a 2-2-2-2 rule is preferred because it can react much faster than the 7-7-4-3 or other rules. Since the decoder input is relatively low speed sampled (8 kilohertz) PCM, the input looks more like a staircase type rather than smooth speech samples. Hence it requires a faster reacting rule to track the signal.

However a 2-2-2-2 rule without reset will have bigger overshoot than a 2-2-2-2 rule with reset. Excessive overshoot creates extra distortion. Therefore 2-2-2-2 with reset is the much more desirable rule to use.

Other pattern detection rules are described and embodiments illustrated in said second Song application.

More Detailed Description of Part of the Encoder

A more detailed description of the portion of the encoder shown in FIG. 4 as the digital step accumulator 24, the uniform filter 28, and the LPCM-to-CPCM converter 36 is shown in FIG. 8.

As described above, the output of the ADM step controller 20 in FIG. 4 comprises a signal word on the output path 22 which has the sign bit on lead 86 and a seven-bit word on path 79 in which the signal on one of the seven leads is true at any time to indicate the magnitude of the increment signified by each of the ADM signals on line 18. In the digital step accumulator 24 the sign bit switch 184 combines the sign bit with the magnitude signal. Since the adder which follows is most easily implemented with signals in two's compliment form, the sign bit switch 184 should provide a conversion from the sign-magnitude form to the two's compliment form. This may be implemented by either serial or parallel digital signal apparatus. A parallel implementation is shown in FIG. 8 comprising an inverter 809 to invert the sign bit from lead 86, and a set of gates for handling the magnitude signals on the seven leads from path 79. This logic comprises six exclusive OR gates 811 to 816 having input ports from the bit 1 through bit 6 leads of path 79 respectively and each having another input port connected to the output of the inverter 809, a set of AND gates 831 to 836, each having an inverter input, and another set of six exclusive OR gates 851 to 856. The bit 0 signal from path 79 is supplied to the corresponding output lead on path 188 whether the input signal is positive or negative. For positive signals there is a zero on lead 810 which causes the exclusive OR gates 811 to 816 to invert all of the signals from the leads bit 1 to bit 6 at the outputs 821 to 826. With a zero on lead 810 the gate 831 will always have a zero at its output which causes all of the other gates 832 to 836 to also have zeros at their outputs. This effectively causes all of the exclusive OR gates 851–856 to again invert the signals from leads 821 to 826 so that the signals at the output for bits 1 to 6 are the same as the inputs from paths 79. Also the signal from lead 810 is supplied to the output leads for bit 7 to bit 11 so that they are all zeros.

For the situation in which the sign is negative a one appears on lead 810 to inputs of the exclusive OR gates 811 to 816 so that the input bits from leads bit 1 to bit 6 of path 79 are inverted to the leads 821 to 826. The AND gate 831 has a one at the input port from lead 810, and therefore if the signal on lead bit 0 is a zero the output of gate 831 is a one whereas if the signal on lead bit 0 is a one, the output of gate 831 is a zero. Assuming that the bit 0 is a zero, causing the output of gate 831 to be a one, the exclusive OR gate 851 then inverts the signal from lead 821 to its output. In like manner if the signal on lead 821 for bit 1 is a one then the output of gate 832 is a one and an exclusive OR gate 852 inverts the signal from lead 822 to its output. As long as each of the succeeding bits is a zero the output from the corresponding exclusive OR gate in like manner is inverted, one of the bits 0 through 6 from path 79 will always be a one. Assume that this is bit 1, in which case a signal zero also appears on lead 821, since the signal on lead 841 from gate 831 is a one, the output of gate 851 is a one. The output of gate 832, however, becomes a zero so that the bit 2 signal which is inverted to the output on lead 822, becomes unchanged by gate 842. In like manner each of the succeeding gates 833 to 836 has its output at a one so that the exclusive OR gates 852 to 856 do not change the signals. Thus it is readily seen that for negative input signals the low order bits which are all zeros are repeated to the output unchanged and likewise the first bit which is a one is repeated unchanged, and all succeeding bits are inverted. This is the algorithm required for negative signals in the conversion from sign magnitude the two's complement form. Also note the sign bits 7 to bit 11 will always be one for negative signals.

A parallel implementation is also shown for the 12-bit adder 192 of the digital step accumulator. In accordance therewith a 12-bit parallel-to-parallel register 196 is used between the output 26 of the adder, and the input on path 194. The parallel register 196 will effectively delay the word by one time slot of the sampling frequency Fs. The increment signals from path 188 are continuously accumulated by the adder 192 and register 196, so that the signal word on path 26 effectively is the full LPCM digital value of the original analog signal with a sample during each time slot of the timing signal Fs.

An overflow detector 870 is required with the digital step accumulator. Note that the maximum positive signal on path 26 comprises a sign bit zero followed by all the other bits being ones, and the maximum negative signal is a sign bit one followed by all of the other bits being zeros, except the LSB bit. Thus a positive signal on path 188 when the signal would in the register 196 is already at the maximum positive value would cause an overflow condition, and likewise a negative signal on path 188 when the signal word on register 196 is already maximum negative would cause a negative overflow. To prevent this the overflow detector 870 is designed to detect maximum positive or maximum negative condition and to inhibit the adder from further change, that is from adding a positive signal to a signal that already is the maximum positive value or to add a negative signal from path 188 to a signal word from path 196 that is already at the maximum negative value while permitting a negative signal on path 188 to be added to a maximum positive signal or a positive signal to be added to a maximum negative signal. Typical overflow detector logic is shown in the first Song application identified above.

Whenever the result in register 196 is a total of zero, a reset signal on lead 875 is supplied to the integrater 92 as shown in FIG. 4. This provides for the integrater accurately tracking with the output signals from the encoder. This feature is explained in the first Song application identified above.

A parallel implementation is also shown in FIG. 8 for the uniform filter 28. It comprises a 15-bit adder 801 and a 15-bit parallel to parallel register 802. Output from this filter to the converter 36 is required at the 8-kilohertz word timing rate whereas the input to a filter is at the sampling frequency Fs. Since the filter is designed to use a value of N equal 8, eight samples from path 26 are added and accumulated in the register 802. The eight samples may be consecutive, or six samples may be skipped between them, in order to reduce the processing speed. The resulting signal after accumulation of eight samples is supplied over path 34 to the converter 36. The register 802 is then reset to zero, in preparation for accumulation of the next eight samples. The division by 8 from the filter 28 is accomplished by considering the least significant bits as binary bits following the binary point, that is the entire word is considered as being shifted by three bits. There is also a truncation by eliminating the least two significant bits of path 34 as the word is supplied to the converter 36.

In the converter 36 the sample word received each 125 microseconds is first converted from the two's complement to the sign-magnitude format in a converter 881. One format or implementation for converting the LPCM signals on path 883 to CPCM signals on path 885 is to make use of a 13 × 7 programmed logic array 884. This array may be programmed for any conversion algorithm such as the mu 255 law. The programmed logic array could be arranged to handle the sign bit, but it is greatly simplified if only the magnitude of the signal words is processed therein. The sign bit is then taken directly from the two's complement to sign-magnitude converter via a lead 882 to an output interface shift register 886 by a lead 882. The CPCM output magnitude signal from path 885 is also stored in the parallel to serial shift register.

Another format for an LPCM to a CPCM converter is shown in the said first Song application.

While FIGS. 4 and 8 show the digital step accumulator 24 using 12-bit words, and the uniform filter 28 with 15-bit words; these could be 13 or 14 bits for the step accumulator 24 and 16 or 17 bits for the filter 28, depending on system requirements.

More Detailed Description of Part of the Decoder

A more detailed showing of the CPCM-to-LPCM converter 40, the filter and speed change unit 44 and the digital comparator 510 along with the pattern detector 176 of the decoder of FIG. 5 is shown in FIG. 9.

The CPCM-to-LPCM converter 40 first of all requires an 8-bit series to parallel shift register 910 to repeat the serial signals on input path 39 to path 911. One implementation for making the conversion from the compressed-to-linear pulse code modulation is to make use of a read only memory 913. The input CPCM signal has eight bits one of which is the sign carried on lead 912 directly to the output and the magnitude comprises 7 bits carried in parallel form on path 911. Thus the read only memory requires 27 words of 13 bits each, the 13 bits which are the magnitude of the LPCM signal being supplied on path 914, the path 42 being the combination of the sign on 912 and the magnitude on path 914.

The filter and speed change unit 44 comprises a 15-bit adder 920 along with a 14-bit parallel to parallel register 922 which is operated to accumulate each two samples on path 42. The filter is operated at a 16 kilohertz rate to accomplish the speed change and the sample is taken output on line 42 every 62½ micro seconds, at the output of the read only memory 913. The division by 2 for the filter operation is accomplished by shifting the output one bit.

The digital comparator 510 operates most conveniently in a straight binary signal format, so the sign on path 921 is inverted by an inverter 931. The magnitude signal is also truncated so that a total of 12 bits are supplied to the comparator 510. In the straight binary coding format the negative sign is a zero and the positive sign is a one, and the magnitude portion of the signal is the same as in the two's complement form. Thus the maximum negative signal is all zeros, and the smallest negative signal is a zero followed by all ones. The zero signal is a one followed by all zeros and the maximum positive signal is all ones. The signal on path 50 will also be in the same straight binary format by passing the sign bit through an inverter 932. To increase the speed from the 16-kilohertz on path 921 from unit 44 to ADM signals on path 53 at the frequency Fs, the input on path 921 is held while successive samples at the frequency Fs are supplied over path 50 and successively compared.

The pattern detector 176 has been described above. The digital step accumulator 48 shown in FIG. 5 may be substantially similar to the digital step accumulator 24 shown in FIG. 8.

While FIGS. 5 and 9 and the description thereof show the digital comparator 510 and the digital step accumulator 48 using signals truncated to 12-bit words; these could be 13 or 14 bits depending on the resolutions required for various system applications.

I claim:

1. In a telephone communication system having a plurality of transmission lines over which voice signals are transmitted in digital form using pulse code modulation; sending means comprising analog input means over which analog signals are received, adaptive delta modulation means connected to said analog input means and operative to convert said analog signals to adaptive-delta-modulated pulse signals, and sending digital converter means coupled to said adaptive delta modulation means and operative to convert said adaptive delta modulation pulse signals to pulse code modulation signals;

receiving means comprising digital input means over which digital signals which are pulse code modulated are received, receiving digital converter means coupled to said digital input means to convert said digital signals to adaptive-delta-modulated pulse signals, and adaptive-delta-modulation to analog converter means coupled to said receiving digital converter and operative to convert said adaptive-delta-modulated pulse signals to analog output signals;

said sending means and said receiving means each including step controller means, each of said step controller means being operative to derive pulse coded step size signals having sign and magnitude related respectively to the sign and pattern of the adaptive-delta-modulation pulse signals, said step controller means of the sending means having an output connected common to said adaptive delta modulation means and said sending digital converter means, said step controller means of the receiving means having output means connected common to said receiving digital converter means and said adaptive-delta-modulation to analog converter means.

2. A telephone communication system as set forth in claim 1, wherein said sending means further includes digital filter means coupled to the output of said sending digital converter means for smoothing said pulse code modulation signals, first speed converter means included in said digital filter means for decreasing the speed of the pulse code modulation signals output from said digital filter means to a given value compatible for use with a pulse code modulation telephone system; wherein said receiving means includes second speed converter means to increase the speed from said given value at said digital input means to a higher value for said adaptive-delta-modulated pulse signals.

3. A telephone communication system as set forth in claim 2, wherein said sending means and said receiving means each includes both an analog step accumulator means and a digital step accumulator means connected to the output of said step controller means thereof;

each said analog step accumulator comprising a digital-to-analog converter to convert each said pulse coded step size signal to an analog step size signal, and an integrator for accumulating said analog step size signals;

each said digital step accumulator comprising an adder and a register for adding each said pulse coded step size signal to a preceding linear pulse coded word stored in said register and accumulating the result in said register;

said adaptive delta modulation means of said sending means including an analog comparator to compare said analog signals from said analog input means to signals from said integrator of said analog step accumulator of said sending means to produce said adaptive-delta modulated pulse signals in said sending means;

said receiving digital converter means including a digital comparator for comparing signals from said second speed converter means to signals from said digital step accumulator of said receiving means to produce said adaptive-delta-modulated pulse signals in said receiving means.

4. An encoder for a pulse code modulation telephone system, said encoder comprising input means over which analog signals are received, adaptive delta modulation means connected to said input means and operative to convert said analog signals to adaptive delta modulation signals, and digital converter means coupled to said adaptive delta modulation means and operative to convert said adaptive delta modulation signals to pulse code modulation signals;

said encoder including a step controller means having an output connected common to said adaptive delta modulation means and said digital converter means, said step controller means being coupled at the output of said adaptive modulation means and the input of said digital converter means and being operative to derive pulse coded step size signals representing the increment between samples of said analog signals.

5. An encoder as set forth in claim 4 which further includes digital filter means coupled to the output of said digital converter means for smoothing said pulse code modulation signals.

6. An encoder as set forth in claim 5, wherein the output signals from said digital converter means are linear pulse code modulated signals, and wherein said digital filter means comprises means operable to add together N samples of the linear pulse code modulated signals, and then divide by N to thereby provide uniform filtering, and a reduction to a lower speed linear pulse code modulated signals.

7. An encoder as set forth in claim 5, which includes both an analog step accumulator means and a digital step accumulator means connected to the output of said step controller means, wherein said adaptive delta modulation means includes said analog step accumulator means and an analog comparator having inputs from said input means and said analog step accumulator means, operative to compare the analog signals at the last said inputs to produce said adaptive delta modulation signals.

8. An encoder as set forth in claim 7, wherein said digital step accumulator means comprises a first adder, and a first register which is connected to receive and store the output sum from said first adder, said first adder having inputs from said step controller means and said first register to add said pulse coded step size signals to the sum stored in said first register, so that the sum in said first adder is a linear pulse coded word representing a sample of the full sign and magnitude of said analog signals from said input means.

9. An encoder as set forth in claim 8, wherein said digital filter means comprises a second adder and a second register which is connected to receive and store the output sum from said adder, said second adder having inputs from said digital step accumulator means and said second register, operative to add together N sample words of the linear pulse coded modulated words, and then divide by N to thereby provide uniform filtering, and a reduction to lower speed linear pulse code modulated signals, said second register being reset before each accumulation of N sample words.

10. An encoder as set forth in claim 9, wherein said step controller means includes pattern detection means for detecting predetermined patterns of said adaptive delta modulation signals to produce said pulse coded step size signals.

11. An encoder as set forth in claim 5, further including means connected between the output of said digital filter means and a digital transmission line, operative to convert said linear pulse code modulated signals to compressed pulse code modulated signals.

12. An encoder as set forth in claim 5 wherein said step controller means includes pattern detection means for detecting predetermined patterns of said adaptive modulation signals to produce said pulse codes step size signals.

13. An encoder as set forth in claim 12 wherein said adaptive delta modulation signals have encoded logic states and wherein said pattern detection means includes means connected to receive said adaptive delta modulation signals for providing digital signals discretely indicating identical and alternating logic states of consecutive ones of said adaptive modulation signals, and means responsive to a preselected number of said digital signals indicating said identical and alternating logic states of said consecutive adaptive delta modulation signals for providing step size control signals which indicate either an increase or a decrease of the step size, and said step controller means further includes register means connected to said pattern detection means to count up and down responsive respectively to increase and decrease indications of said step size control signals.

14. An encoder for a pulse code modulation telephone system, said encoder comprising input means over which signals are received in analog format, adaptive delta modulation means, and a linear pulse code modulation converter;

said adaptive delta modulation means comprises an analog comparator, step controller means, and an analog step accumulator; said analog comparator having inputs from said input means and said analog step accumulator and being operative to produce adaptive modulation signals which are coupled to an input of said step controller means, said step controller means comprising digital logic means operative responsive to predetermined sequences of said adaptive modulation signals to produce step size signals each represented as a binary number, said analog step accumulator having means operative to reconstitute the analog signals from said step size signals;

and said linear pulse code modulation converter is coupled to said step controller means and includes digital means to accumulate said step size signals to produce linear pulse code modulation signal;

whereby said step controller means is common for an analog-to-adaptive-delta conversion and an adaptive-delta-to-linear-pulse-code conversion.

15. An encoder as set forth in claim 14, which further includes digital filter means coupled to the output of said linear pulse code modulation connecter for smoothing said pulse code modulation signals.

16. An encoder as set forth in claim 15, wherein said step controller means includes pattern detection means for detecting predetermined patterns of said adaptive delta modulation signals to produce said pulse coded step size signals.

17. An encoder as set forth in claim 16, wherein said adaptive delta modulation signals have encoded logic states and wherein said pattern detection means includes means connected to receive said adaptive delta modulation signals for providing digital signals discretely indicating identical and alternating logic states of consecutive ones of said adaptive modulation signals, and means responsive to a preselected number of said digital signals indicating said identical and alternating logic states of said consecutive adaptive delta modulation signals for providing step size control signals which indicate either an increase or a decrease of the step size, and said step controller means further includes counter means connected to said pattern detection means to count up and down responsive respectively to increase and decrease indications of said step size control signals.

18. An encoder as set forth in claim 17, wherein said pattern detection means further includes bistable means for storing said step size control signals with states which indicate an increase or a decrease in an increment to said linear pulse code modulated signal represented by a last detected pattern of said adaptive delta modulation signals, and means responsive to the state of said bistable means and to preselected counts of said counted identical and alternating logic states of said consecutive adaptive delta modulation signal for providing said step size control signals.

19. An encoder as set forth in claim 15, wherein said digital means to accumulate step size signals comprises a first adder, and a first register which is connected to receive and store the output sum from said first adder, said first adder having inputs from said step controller means and said first register to add said pulse coded step size signals to the sum stored in said first register, so that the sum in said first adder is a linear pulse coded word representing a sample of the full sign and magnitude of said analog signals from said input means.

20. An encoder as set forth in claim 19, wherein said digital filter means comprises a second adder and a second register which is connected to receive and store the output sum from said second adder, said second adder having inputs from said digital step accumulator means and said second register, operative to add together N sample words of the linear pulse coded modulated words, and then divide by N to thereby provide uniform filtering, and a reduction to lower speed linear pulse code modulated signals, said second register being reset before each accumulation of N sample words.

21. An encoder as set forth in claim 15, further including means connected between the output of said digital filter means and a digital transmission line, operative to convert said linear pulse code modulated signals to compressed pulse code modulated signals.

22. A decoder for a pulse code modulation telephone system, said decoder comprising digital input means over which digital signals comprising pulse code modulated words are received, receiving digital converter means coupled to said digital input means to convert said digital signals to adaptive-delta-modulated pulse signals, and adaptive-delta-modulation to analog converter means coupled to said receiving digital converter and operative to convert said adaptive-delta-modulated pulse signals to analog output signals;

said decoder including a step controller means connected common to said receiving digital converter means and said adaptive-delta-modulation to analog converter means, said step controller means being coupled at the output of said digital converter means and the input of said adaptive-delta-modulation to analog converter means, and being operative to derive step size signals representing the increment between words of said digital signals.

23. A decoder as set forth in claim 22, which includes both an analog step accumulator means and a digital step accumulator means connected to the output of said step controller means:

wherein said receiving digital converter means includes said digital step accumulator means and a digital comparator having inputs from said digital input means and said digital step accumulator means operative to compare the digital signals at the last mentioned said inputs to produce said adaptive delta modulation signals.

24. A decoder as set forth in claim 23, wherein said step controller means includes pattern detection means for detecting predetermined patterns of said adaptive delta modulation signals to produce said pulse coded step size signals.

25. A decoder as set forth in claim 24, wherein said adaptive delta modulation signals have encoded logic states and wherein said pattern detection means includes means connected to receive said adaptive delta modulation signals for providing digital signals discretely indicating identical and alternating logic states of consecutive ones of said adaptive modulation signals, and means responsive to a preselected number of said digital signals indicating said identical and alternating logic states of said consecutive adaptive delta modulation signals for providing step size control signals which indicate either an increase or a decrease of the step size, and said step controller means further includes counter means connected to said pattern detection means to count up and down responsive respectively to increase and decrease indications of said step size control signals.

26. A decoder as set forth in claim 23 wherein said digital step accumulator means comprises a first adder, and a first register which is connected to receive and store the output sum from said first adder, said first adder having inputs from said step controller means and said first register to add said pulse coded step size signals to the sum stored in said first register, so that the sum in said first adder is a linear pulse coded word representing a sample of the full sign and magnitude of said digital signals from said input means.

27. A decoder as set forth in claim 26 in which said receiving digital converter means includes speed converter and digital filter means which comprises a second adder and a second register connected to add each sample from said digital input means to the number in said second register and divide by two, and connected to supply the resulting signal samples to digital comparator means; whereby each said resulting signal sample is compared a plurality of times with signals from said digital step accumulator means to thereby increase the signal speed.

28. A decoder as set forth in claim 22, wherein said digital signals at said digital input means are compressed pulse code modulated signals, and means in said receiving digital converter means to convert these signals to linear pulse code modulation signals for input to said digital filter and speed converter.

29. In an encoder for a pulse code modulation telephone system, said encoder comprising input means over which analog signals are received, a signal processing path including an analog to adaptive delta modulation converter circuit including a comparator circuit having a first and a second input, means connecting the received analog signals to said first input of said comparator circuit, and an adaptive delta modulation step controller connected to the output of said comparator circuit for providing pulse coded step size signals representing the increment between samples of the analog signals including path detection means connected to the output of said comparator circuit, an up/down counter connected to the output of said pattern detection means, and a decoder connected to the output of said up/down counter, digital step accumulator means connected to the output of said decoder in said adaptive delta modulator step controller for converting said adaptive delta modulation signals to linear pulse code coded modulated signals, and means connected to a predetermined point in said signal processing path for providing analog signals representative of the signals at such point in the path to the second input of said comparator circuit.

* * * * *